US011640988B2

(12) United States Patent
Liao et al.

(10) Patent No.: US 11,640,988 B2
(45) Date of Patent: *May 2, 2023

(54) CONFINED EPITAXIAL REGIONS FOR SEMICONDUCTOR DEVICES AND METHODS OF FABRICATING SEMICONDUCTOR DEVICES HAVING CONFINED EPITAXIAL REGIONS

(71) Applicant: Intel Corporation, Santa Clara, CA (US)

(72) Inventors: Szuya S. Liao, Hillsboro, OR (US); Michael L. Hattendorf, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/390,483

(22) Filed: Jul. 30, 2021

(65) Prior Publication Data

US 2021/0359110 A1 Nov. 18, 2021

Related U.S. Application Data

(60) Continuation of application No. 16/589,936, filed on Oct. 1, 2019, now Pat. No. 11,127,841, which is a (Continued)

(51) Int. Cl.
*H01L 29/78* (2006.01)
*H01L 29/08* (2006.01)
(Continued)

(52) U.S. Cl.
CPC ............ *H01L 29/66795* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS 7,667,271 B2   2/2010  Yu
8,357,569 B2   1/2013  Pawlak
(Continued)

FOREIGN PATENT DOCUMENTS

JP        2010-073869     4/2010
KR   10-2011-0036505     4/2011
(Continued)

OTHER PUBLICATIONS

Search Report for European Patent Application No. 14887497.7 dated Sep. 27, 2017, 9 pages.
(Continued)

*Primary Examiner* — Telly D Green
(74) *Attorney, Agent, or Firm* — Schwabe, Williamson & Wyatt, P.C.

(57) ABSTRACT

Confined epitaxial regions for semiconductor devices and methods of fabricating semiconductor devices having confined epitaxial regions are described. For example, a semiconductor structure includes a plurality of parallel semiconductor fins disposed above and continuous with a semiconductor substrate. An isolation structure is disposed above the semiconductor substrate and adjacent to lower portions of each of the plurality of parallel semiconductor fins. An upper portion of each of the plurality of parallel semiconductor fins protrudes above an uppermost surface of the isolation structure. Epitaxial source and drain regions are disposed in each of the plurality of parallel semiconductor fins adjacent to a channel region in the upper portion of the semiconductor fin. The epitaxial source and drain regions do not extend laterally over the isolation structure. The semiconductor structure also includes one or more gate elec-
(Continued)

trodes, each gate electrode disposed over the channel region of one or more of the plurality of parallel semiconductor fins.

23 Claims, 16 Drawing Sheets

Related U.S. Application Data division of application No. 15/867,210, filed on Jan. 10, 2018, now Pat. No. 10,461,177, which is a division of application No. 15/119,370, filed as application No. PCT/US2014/032072 on Mar. 27, 2014, now Pat. No. 9,882,027.

(51) Int. Cl.
*H01L 29/165* (2006.01)
*H01L 29/66* (2006.01)
*H01L 21/8234* (2006.01)

(52) U.S. Cl.
CPC ...... *H01L 29/0847* (2013.01); *H01L 29/6656* (2013.01); *H01L 29/785* (2013.01); *H01L 29/7848* (2013.01); *H01L 29/165* (2013.01)

(56) References Cited

U.S. PATENT DOCUMENTS

| | | | |
|---|---|---|---|
| 8,368,149 B2 | 2/2013 | Lander | |
| 8,703,556 B2 | 4/2014 | Kelly | |
| 8,928,086 B2 | 1/2015 | Utomo | |
| 9,190,520 B2 | 11/2015 | Utomo | |
| 11,127,841 B2 * | 9/2021 | Liao | H01L 29/0847 |
| 2005/0202618 A1 | 9/2005 | Yagishita | |
| 2007/0221956 A1 | 9/2007 | Inaba | |
| 2008/0265321 A1 | 10/2008 | Yu et al. | |
| 2009/0095980 A1 | 4/2009 | Yu et al. | |
| 2011/0073919 A1 | 3/2011 | Pawkak | |
| 2011/0147842 A1 | 6/2011 | Cappellani et al. | |
| 2011/0272738 A1 | 11/2011 | Oh et al. | |
| 2012/0248536 A1 | 10/2012 | Lander | |
| 2013/0001705 A1 | 1/2013 | Su et al. | |
| 2013/0005114 A1 | 1/2013 | Maszara et al. | |
| 2013/0011705 A1 | 1/2013 | Hirsch | |
| 2013/0052778 A1 | 2/2013 | Liao et al. | |
| 2013/0299951 A1 | 11/2013 | Tung | |
| 2014/0065782 A1 | 3/2014 | Lu et al. | |
| 2014/0077277 A1 | 3/2014 | Bao | |
| 2014/0191297 A1 | 7/2014 | Utomo | |
| 2014/0252489 A1 | 9/2014 | Yu | |
| 2014/0377924 A1 | 12/2014 | Utomo | |
| 2015/0041908 A1 | 2/2015 | Adam | |

FOREIGN PATENT DOCUMENTS

| | | |
|---|---|---|
| KR | 10-2014-0029094 | 3/2014 |
| TW | 201104866 | 2/2011 |
| TW | 201133793 | 10/2011 |
| TW | 201409581 | 3/2014 |

OTHER PUBLICATIONS

Non-Final Office Action for Taiwan Patent Application No. 104105369 dated Dec. 23, 2015, 5 pgs.
International Search Report and Written Opinion for PCT Patent Application No. PCT/US2014/032072 dated Dec. 10, 2014, 11 pgs.
International Preliminary Report on Patentability for PCT Patent Application No. PCT/US2014/032072 dated Oct. 6, 2016, 8 pgs.
Preliminary Exam Report for Malaysian Patent Application No. PI2016703114 dated Dec. 20, 2016, 3 pgs.
Notice of Allowance for Taiwan Patent Application No. 104105369 dated Aug. 8, 2016, 2 pgs.
Office Action for Taiwan Patent Application No. 105109006 dated Jun. 5, 2018, 5 pgs.
Office Action for Taiwan Patent Application No. 105109006 dated Oct. 25, 2018, 2 pgs.
Office Action from Chinese Patent Application No. 201480076471.9 dated Jan. 14, 2019, 9 pages.
Office Action from Chinese Patent Application No. 201480076471.9 dated Jul. 15, 2019, 6 pages.
Office Action from Chinese Patent Application No. 201480076471. 9, dated Nov. 5, 2019, 7 pages.
Exam Report for Malaysian Patent Application No. PI2016703114, dated Nov. 15, 2019, 3 pgs.
Office Action for Korean Patent Application No. 10-2016-7022426, dated Mar. 19, 2020, 9 pgs.
Office Action from European Patent Application No. 14887497.7, dated Apr. 14, 2020, 4 pgs.
Notice of Allowance for Chinese Patent Application No. 201480076471. 9, dated Apr. 7, 2020, 4pgs.
Notice of Allowance for Korean Patent Application No. 10-2016-7022426, dated Oct. 21, 2020, 2 pgs.
ISA search report for PCT/US2014/032072 filed Sep. 27, 2016. (Year: 2016).

* cited by examiner

500

| Fin Pitch (ZPV) | Fin Height (HSi) | Fin Width (WSi) | REXT Ratio of (Fully Merged Epi) to (Confined Epi) | REXT Ratio of (Barely Merged Epi) to (Confined Epi) |
|---|---|---|---|---|
| 40nm | 60nm | 6nm | 6.2 | 3.5 |
| 30nm | 60nm | 6nm | 8.2 | 4.7 |
| 20nm | 60nm | 6nm | 12.3 | 7.1 |

CONFINED EPITAXIAL REGIONS FOR SEMICONDUCTOR DEVICES AND METHODS OF FABRICATING SEMICONDUCTOR DEVICES HAVING CONFINED EPITAXIAL REGIONS

CLAIM OF PRIORITY

This patent application is a continuation of U.S. patent application Ser. No. 16/589,936, filed Oct. 1, 2019, which is a divisional of U.S. patent application Ser. No. 15/867,210, filed Jan. 10, 2018, now U.S. Pat. No. 10,461,177, issued Oct. 29, 2019, which is a divisional of U.S. patent application Ser. No. 15/119,370, filed Aug. 16, 2016, now U.S. Pat. No. 9,882,027 issued Jan. 30, 2018, which is a U.S. National Phase application under 35 U.S.C. § 371 of International Application No. PCT/US2014/032072, filed Mar. 27, 2014, entitled "Confined Epitaxial Regions for Semiconductor Devices and Methods of Fabricating Semiconductor Devices Having Confined Epitaxial Regions," the entire contents of which are incorporated herein by reference.

TECHNICAL FIELD

Embodiments of the invention are in the field of semiconductor devices and processing and, in particular, confined epitaxial regions for semiconductor devices and methods of fabricating semiconductor devices having confined epitaxial regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 3A illustrates a semiconductor device structure following fin formation, gate electrode formation, and gate spacer formation;

FIG. 3B illustrates the semiconductor device structure of FIG. 3A following epitaxial undercut (EUC) to remove source/drain regions of the fins;

FIG. 3C illustrates the semiconductor device structure of FIG. 3B following epitaxial growth at the locations where fin material was removed; and FIG. 3D illustrates the semiconductor device structure of FIG. 3C following removal of the fin spacers.

FIG. 6A illustrates a semiconductor device structure following fin formation, gate electrode formation, and disposable spacer formation;

FIG. 6B illustrates the semiconductor device structure of FIG. 6A following epitaxial undercut (EUC) to remove source/drain regions of the fins;

FIG. 6C illustrates the semiconductor device structure of FIG. 6B following epitaxial growth at the locations where fin material was removed;

FIG. 6D illustrates the semiconductor device structure of FIG. 6C following removal of the disposable spacers; and FIG. 6E illustrates the semiconductor device structure of FIG. 6D following formation of gate spacers.

FIG. 7A illustrates a semiconductor device structure following fin formation, gate electrode formation, and double spacer formation;

FIG. 7B illustrates the semiconductor device structure of FIG. 7A following epitaxial undercut (EUC) to remove source/drain regions of the fins;

FIG. 7C illustrates the semiconductor device structure of FIG. 7B following inner spacer removal from the fins;

FIG. 7D illustrates the semiconductor device structure of FIG. 7C following epitaxial growth at the locations where fin material was removed, including extended lateral epitaxial growth where the inner spacers were removed; and FIG. 7E illustrates the semiconductor device structure of FIG. 7D following removal of the disposable spacers.

FIG. 8A illustrates a semiconductor device structure following fin formation, gate electrode formation, and gate spacer formation;

FIG. 8B illustrates the semiconductor device structure of FIG. 8A following dielectric layer formation;

FIG. 8C illustrates the semiconductor device structure of FIG. 8B following epitaxial undercut (EUC) to remove source/drain regions of the fins;

FIG. 8D illustrates the semiconductor device structure of FIG. 8C following epitaxial growth at the locations where fin material was removed; and FIG. 8E illustrates the semiconductor device structure of FIG. 8D following removal of the dielectric layer.

DESCRIPTION OF THE EMBODIMENTS

Confined epitaxial regions for semiconductor devices and methods of fabricating semiconductor devices having confined epitaxial regions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments are directed to confined epitaxially grown semiconductor regions for semiconductor devices. In one such embodiment, epitaxial material grown in source/drain regions of a semiconductor device is grown in a manner to restrict the growth to certain targeted locations. One or more embodiments described herein may be applicable to lowering contact resistance for source/drain regions of semiconductor devices, and may be particularly applicable for 10 nanometer (10 nm) technology nodes and smaller. Embodiments described herein may be applicable for metal oxide semiconductor (MOS) devices and complementary metal oxide semiconductor (CMOS) device architectures, such as MOS field effect transistors (MOS-FETs). Specific embodiments may be applicable for non-planar semiconductor devices.

To provide context, strain engineering can be a key strategy in enhancing semiconductor device performance by modulating strain in a transistor channel. The strain can be modulated to enhance electron or hole mobility (e.g., NMOS or PMOS respectively) and thereby improve transistor drive currents. An approach based on epitaxial undercut (EUC) is one of the best known approaches for achieving strain engineering in CMOS technologies. The EUC approach involves embedding selective source/drain materials through epitaxial growth to provide compressive stress to the conduction channel in a PMOS transistor or tensile stress to the conduction channel in an NMOS transistor. Epitaxial source/drain material is grown following an etch-out (undercut etch) of portions of the semiconductor material used to form the semiconductor devices. The epitaxial growth, however, may not strictly replace the removed material in only the locations where the initial semiconductor material is removed. In the case of removing rectangular end portions of a semiconductor fin structure, for example, the epitaxial growth does not typically on its own grow in a manner that is limited to the removed rectangular ends.

Figure 1:
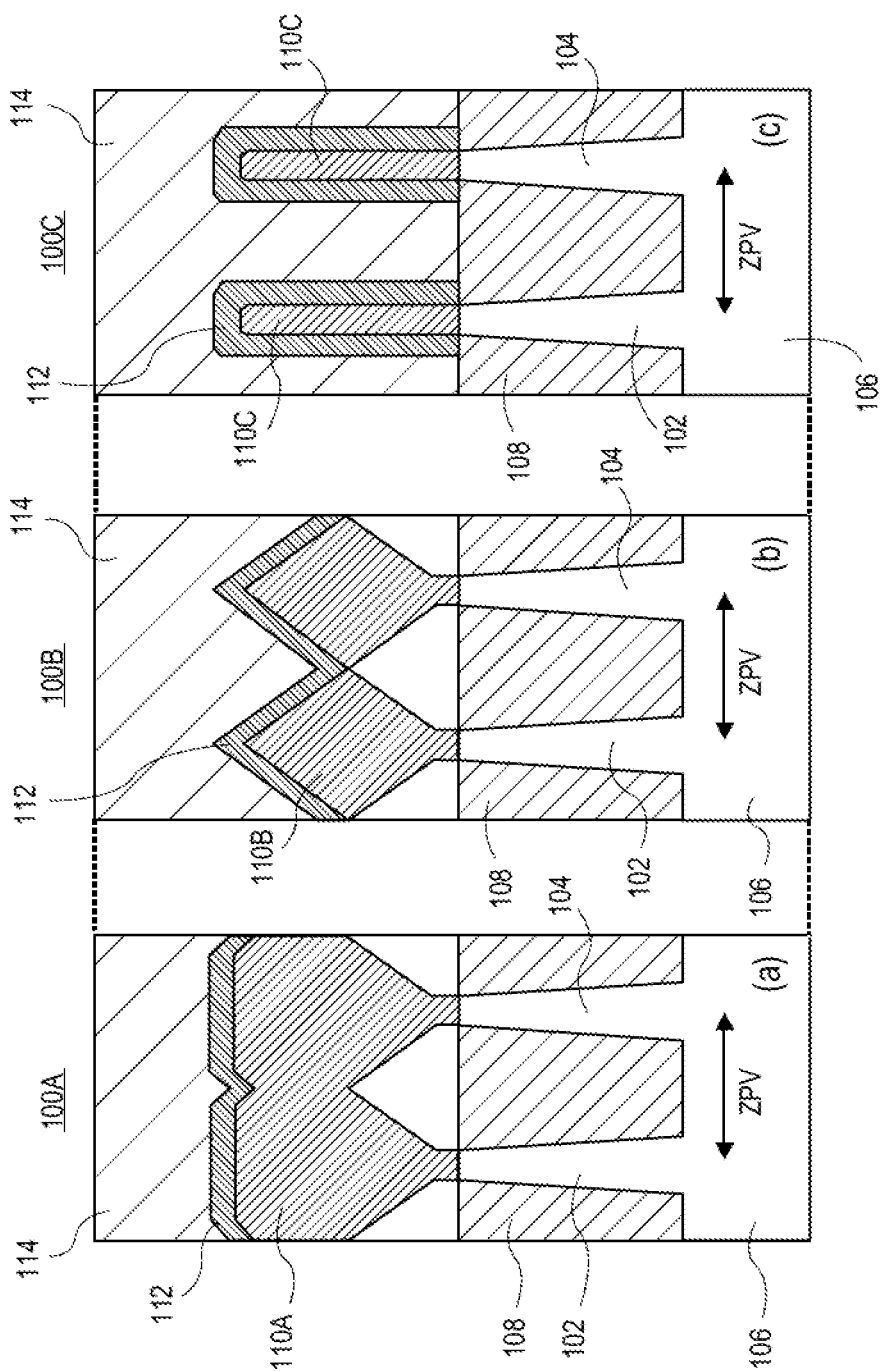
FIG. 1 illustrates cross-sectional views of various pairings of semiconductor devices taken through a source/drain region following epitaxial growth and metallization, in accordance with an embodiment of the present invention.

To exemplify one or more of the concepts involved, FIG. 1 illustrates cross-sectional views of various pairings of semiconductor devices taken through a source/drain region following epitaxial growth and metallization, in accordance with an embodiment of the present invention. Referring to FIG. 1, all pairings (a)-(c) of semiconductor devices 100A-100C are based on a pair of semiconductor fin structures 102 and 104. In the examples, shown, the fins 102 and 104 are formed from bulk semiconductor substrates 106 in that the fins protrude from, and are continuous with, the substrates 106. Furthermore, a portion of each of the pairs of fins 102 and 104 is buried in a dielectric layer 108, such as a shallow trench isolation (STI) oxide layer. Source and drain regions of the fins have been removed, and replaced with a semiconductor material by epitaxial growth to form epitaxial source/drain regions 110A-110C, respectively. A contact metal layer 112 and interconnect metal structure 114 may then be formed above the epitaxial source/drain regions 110A-110C, as is depicted in FIG. 1.

Referring only to part (a) of FIG. 1, the epitaxial source/drain regions 110A of the pair of semiconductor fin structures 102 and 104 are merged (e.g., "fully merged epi"). Such merging of epitaxial material can lead to shorting of adjacent devices. Critical design rules of minimum fin-to-fin distances between two adjacent devices (ZPV) may be required to prevent source/drain epitaxial-epitaxial (epi-to-epi) shorting, potentially limiting scaling of such devices to smaller dimensions. For example, such epi-to-epi merging may become increasingly problematic for scaling fin pitches to meet the scaling requirements for new technologies. Referring only to part (b) of FIG. 1, the epitaxial source/drain regions 110B of the pair of semiconductor fin structures 102 and 104 are not merged but do contact one another (e.g., "in-contact epi" or "barely merged epi"). Such contact of epitaxial material can also lead to shorting of adjacent devices, also limiting scaling of such devices to smaller dimensions.

By contrast to parts (a) and (c) of FIG. 1, referring only to part (c) of FIG. 1, in accordance with an embodiment of the present invention, the epitaxial source/drain regions 110C of the pair of semiconductor fin structures 102 and 104 are not merged nor are they in contact with one another. Such devices may be amendable to scaling to smaller dimensions and narrower pitches because the epitaxially grown regions may be spaced sufficiently to tolerate such scaling. In one such embodiment, the epitaxial source/drain regions 110C are referred to herein as "confined epitxial" or "confined epi" source/drain regions in that adjacent regions are not merged with or in contact with one another. In a specific embodiment, comparing the confined epi regions of part (c) of FIG. 1 in contrast to parts (a) and (b) of FIG. 1, the sidewalls of the confined epi regions 110C are substantially vertical. The sidewalls may slope slight outward or inward, or may be perfectly vertical, but they are substantially vertical since there are no angled facets for the confined epi regions 11)c as there are for the regions 110A and 110B. As described herein, one or more embodiments are directed to process flows that prevent source/drain epitaxial fin merging by restricting lateral epitaxial growth to form such confined epi regions. As such, one or more embodiments described herein may enable further scaling of fin pitches towards improving there-dimensional (3D) transistor layout area and density.

Referring again to FIG. 1, in accordance with an embodiment of the present invention, engineering the shape of the epitaxial regions 110A-110C can be important for minimizing external resistance (REXT). In the three examples, (a)-(c) shown in FIG. 1, an increasing REXT is observed for the merged or in-contact epi regions (110A or 110B) due to contact area restriction. By contrast, referring to 100C, the confined epitaxial regions 110C allow for a contact metal (112) to wrap around all exposed regions of the epitaxial regions 110C, maximizing the contact area and, in turn, minimizing the associated REXT.

It is to be appreciated that prior attempts to reduce REXT for source/drain regions have involved conformal epitaxial growth on a portion of a semiconductor fin structure. However, in such approaches, the semiconductor fin is not etched (undercut) in the source/drain regions prior to epitaxial growth. Accordingly, there are no known approaches to forming a confined epitaxial structure following an undercut process, e.g., for source/drain regions of a semiconductor fin for a non-planar semiconductor device. In accordance with one or more embodiments described herein, source/drain shorting issues for epitaxially grown source/drain regions is resolved at scaled diffusion pitch for applications which utilize an undercutting of semiconductor fin source/drain regions and subsequent under-fill with epitaxial semiconductor material. In some embodiments, REXT of the resulting devices is minimized since a wrapping contact layer may be formed. In some embodiments, mobility enhancement is achieved since the confined epitaxial regions may be strain modulating regions. In some embodiments, the resulting devices have both a minimized REXT and an enhanced channel mobility.

More particularly, one or more embodiments described herein are directed to process flows and approaches for fabricating confined epitaxial regions, such as confined epitaxial regions for source/drain regions of semiconductor devices based on semiconductor fins. In one such embodiment, merging of fin-based source/drain epitaxial regions is prevented by restricting lateral epitaxial growth of the source/drain material following undercut of the source/drain regions of the fin. For example, in a specific embodiment, merging or even contact of epitaxial regions between fins is prevented by building barriers on the fin edges to restrict lateral epitaxial growth post epitaxial undercut. The barriers may subsequently be removed from the epitaxial region edges to allow for fabrication of a low resistance cladding layer or contact metal to wrap around the epitaxial source/drain regions.

Figure 2A:
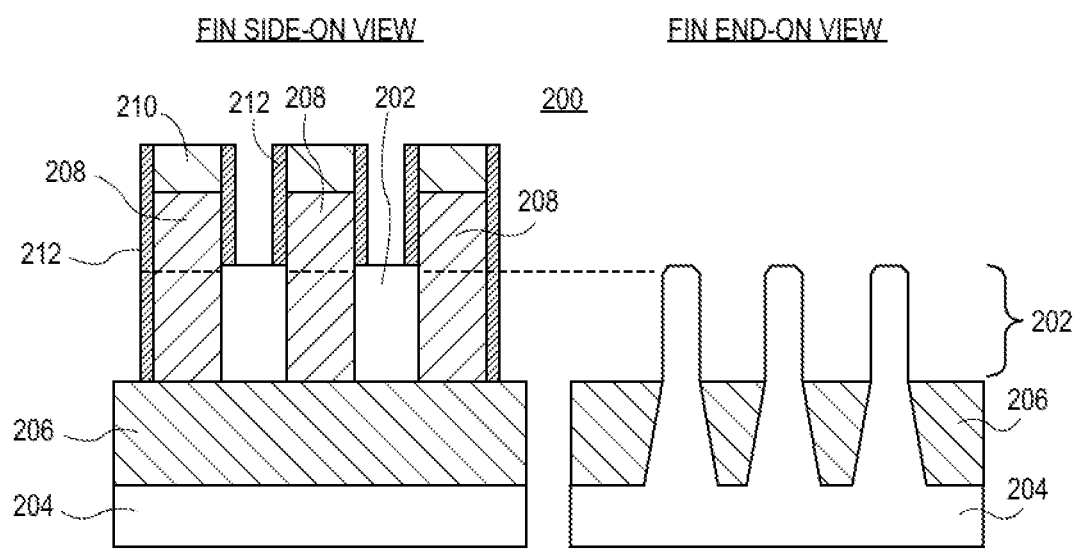
FIGS. 2A-2C illustrate pairings of side-on and end on cross-sectional views of various operations in a method of fabricating non-planar semiconductor devices having merged or in-contact epitaxial source/drain regions, with fin side-on views shown on the left-hand side and fin end-on views shown on the right-hand side.
Figure 2B:
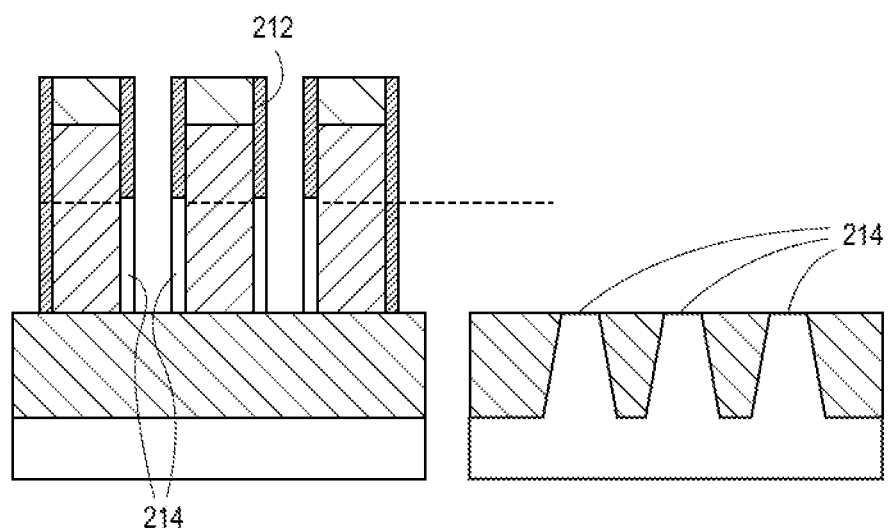
Figure 2C:
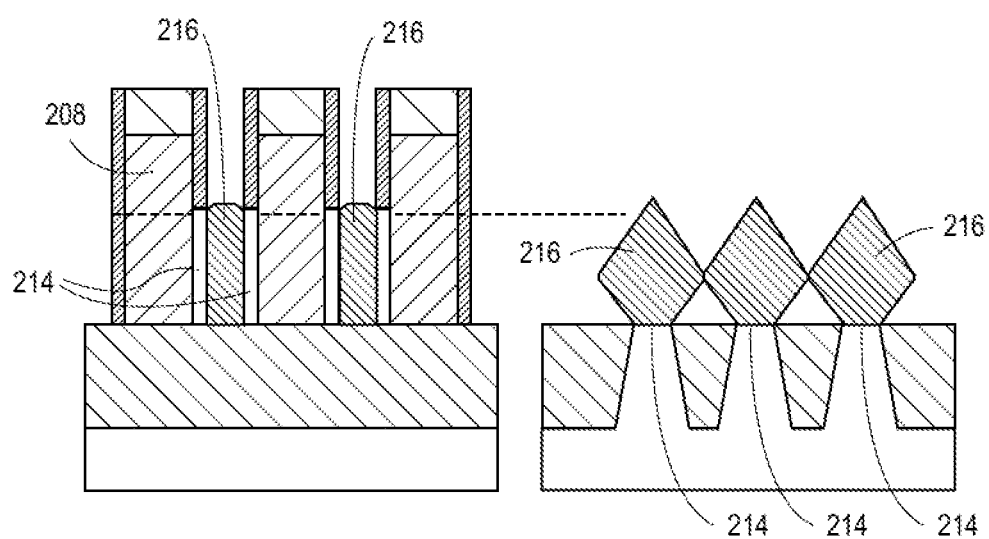

In order to facilitate highlighting of differences between present approaches described herein and conventional semiconductor fabrication approaches, FIGS. 2A-2C illustrate pairings of side-on and end on cross-sectional views of various operations in a method of fabricating non-planar semiconductor devices having merged or in-contact epitaxial source/drain regions, with fin side-on views shown on the left-hand side (gate cut through fin side view) and fin end-on views shown on the right-hand side (fin cut through source/drain side view).

Referring to FIG. 2A, a semiconductor device structure 200 is shown following fin formation, gate electrode formation, and fin spacer etch. In particular, three semiconductor fins 202 are shown protruding from a bulk semiconductor substrate 204, through a shallow trench isolation region 206. Three gate structures 208 (shown having hardmask caps 210 thereon) are formed over the semiconductor fins 202. Gate spacers 212 are also depicted, but following removal of the spacer material from the sides of the fins 202 (as seen in the fin end-on view). It is to be appreciated that in the fin end-on view, the view is taken at the source/drain region locations, so the gate structures are not shown in this view.

Referring to FIG. 2B, the semiconductor device structure of FIG. 2A is shown following epitaxial undercut (EUC) to remove source/drain regions of the fins 202. In particular, regions of the fins 202 that are exposed at the fin ends as well as regions exposed between gate spacers 212 are removed to provide undercut fins 214.

Referring to FIG. 2C, the semiconductor device structure of FIG. 2B is shown following epitaxial growth at the locations where fin material was removed. In particular, semiconductor material regions 216 are grown epitaxially at source/drain regions of the undercut fins 214. As shown on the left-hand side of FIG. 2C, the epitaxial growth between gate structures 208 is confined in the directions shown. However, as shown on the right-hand side of FIG. 2C, no barriers exist to prevent merging (or at least contact) of the epitaxially grown semiconductor material regions 216 between undercut fins 214.

By contrast to the conventional epitaxial growth approach described in association with FIGS. 2A-2C, FIGS. 3A-3D illustrate pairings of side-on and end on cross-sectional views of various operations in a method of fabricating non-planar semiconductor devices having confined epitaxial source/drain regions, with fin side-on views shown on the left-hand side (gate cut through fin side view) and fin end-on views shown on the right-hand side (fin cut through source/drain side view), in accordance with an embodiment of the present invention.

Figure 3A:
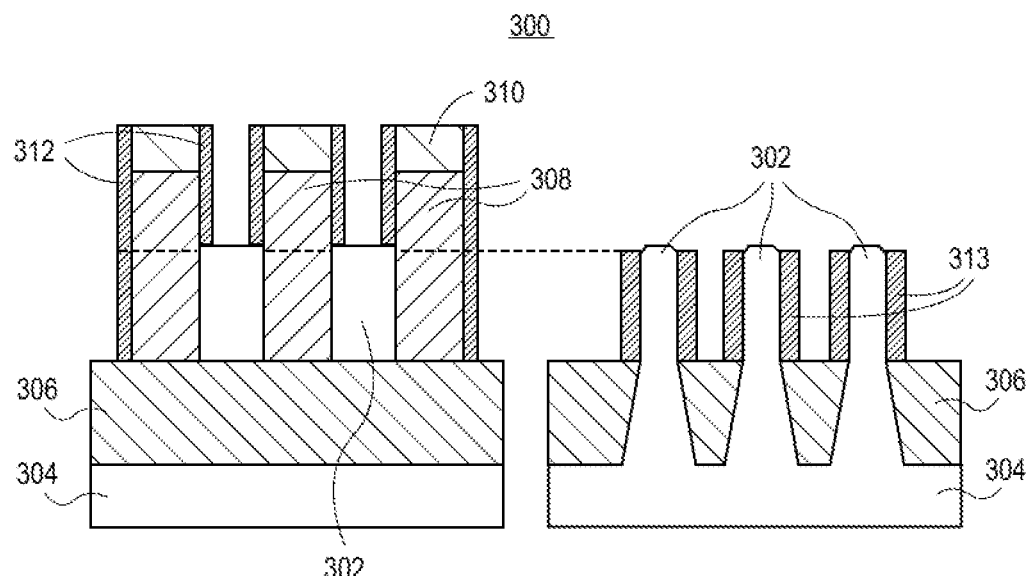
FIGS. 3A-3D illustrate pairings of side-on and end on cross-sectional views of various operations in a method of fabricating non-planar semiconductor devices having confined epitaxial source/drain regions, with fin side-on views shown on the left-hand side and fin end-on views shown on the right-hand side, in accordance with an embodiment of the present invention, where.

Referring to FIG. 3A, a semiconductor device structure 300 is shown following fin formation, gate electrode formation, and gate spacer formation. In particular, three semiconductor fins 302 are shown protruding from a bulk semiconductor substrate 304, through a shallow trench isolation region 306. Three gate structures 308 (shown having hardmask caps 310 thereon) are formed over the semiconductor fins 302. Gate spacers 312 are also depicted. In contrast to the structure 200 of FIG. 2A, the structure 300 of FIG. 3A is not subjected to spacer removal from the sides of the fins 302. As such, as seen in the fin end-on view, fin spacers 313 remain. It is to be appreciated that in the fin end-on view, the view is taken at the source/drain region locations, so the gate structures are not shown in this view.

Figure 3B:
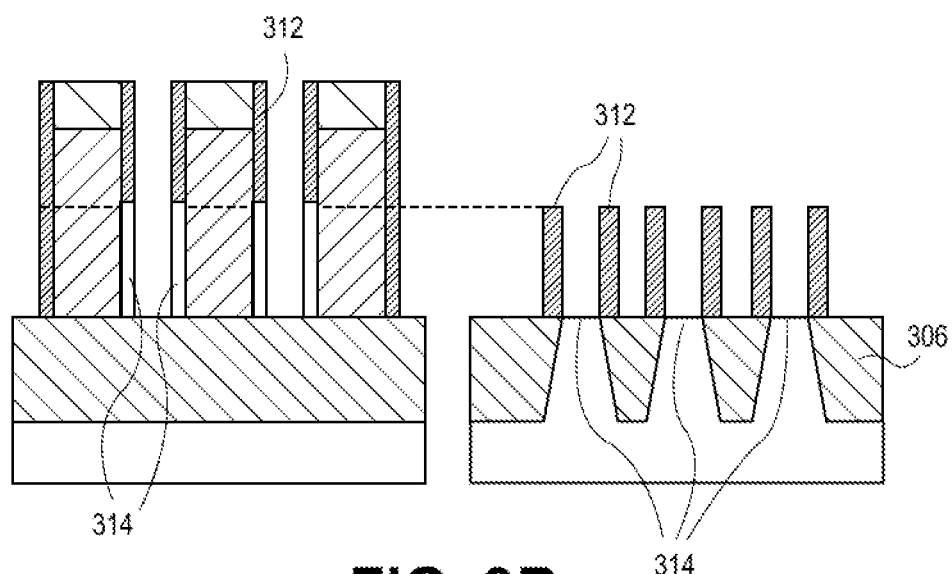

Referring to FIG. 3B, the semiconductor device structure of FIG. 3A is shown following epitaxial undercut (EUC) to remove source/drain regions of the fins 302. In particular, regions of the fins 302 that are exposed at the fin ends as well as regions exposed between gate spacers 312 are removed to provide undercut fins 314. The EUC process is selective to the spacer material and, accordingly, the fin spacers 313 remain standing, as depicted in FIG. 3B. It is to be appreciated that although the extent of EUC is shown as providing undercut fins having a same height as the height of the shallow trench isolation region 306, the EUC process can also be used to provide undercut fins that are etched to some extent below the height of the shallow trench isolation region 306, or the etch may be terminated to leave some portion of the undercut fins above the height of the height of the shallow trench isolation region 306.

Figure 3C:
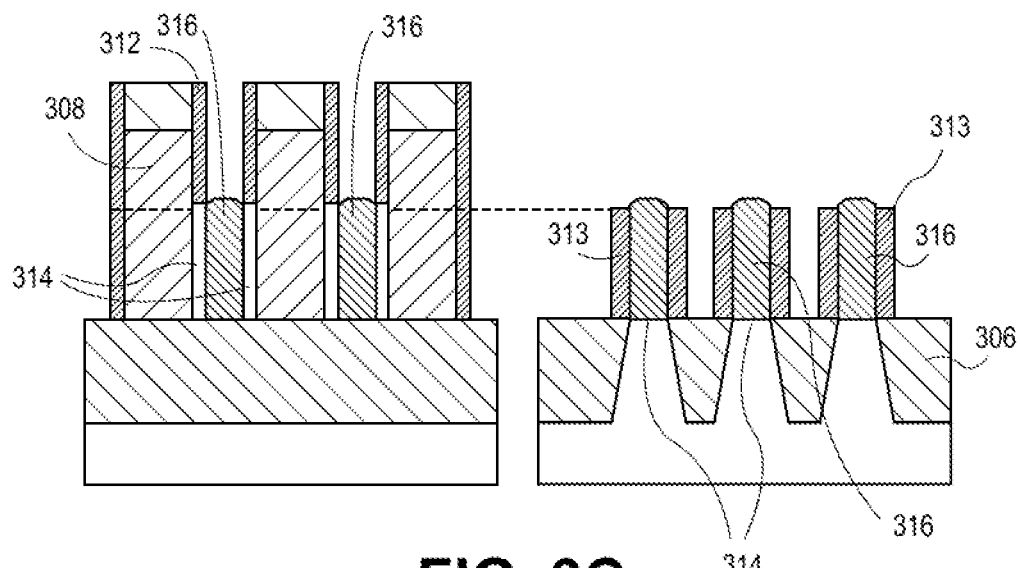

Referring to FIG. 3C, the semiconductor device structure of FIG. 3B is shown following epitaxial growth at the locations where fin material was removed. In particular, semiconductor material regions 316 are grown epitaxially at source/drain regions of the undercut fins 314. As shown on the left-hand side of FIG. 3C, the epitaxial growth between gate structures 308 is confined in the directions shown. Additionally, as shown on the right-hand side of FIG. 3C, the fin spacers 313 prevent merging (and any contact) of the epitaxially grown semiconductor material regions 316 between undercut fins 314, leaving confined epitaxial source/drain regions. It is to be appreciated that although the extent of epitaxial growth is shown as providing confined epitaxial regions having approximately a same height as the height of the height of the original fins, the epitaxial growth process can also be used to provide confined epitaxial regions that are formed to some extent below the height of the original fins, or that are formed to some extent above the height of the original fins.

Figure 3D:
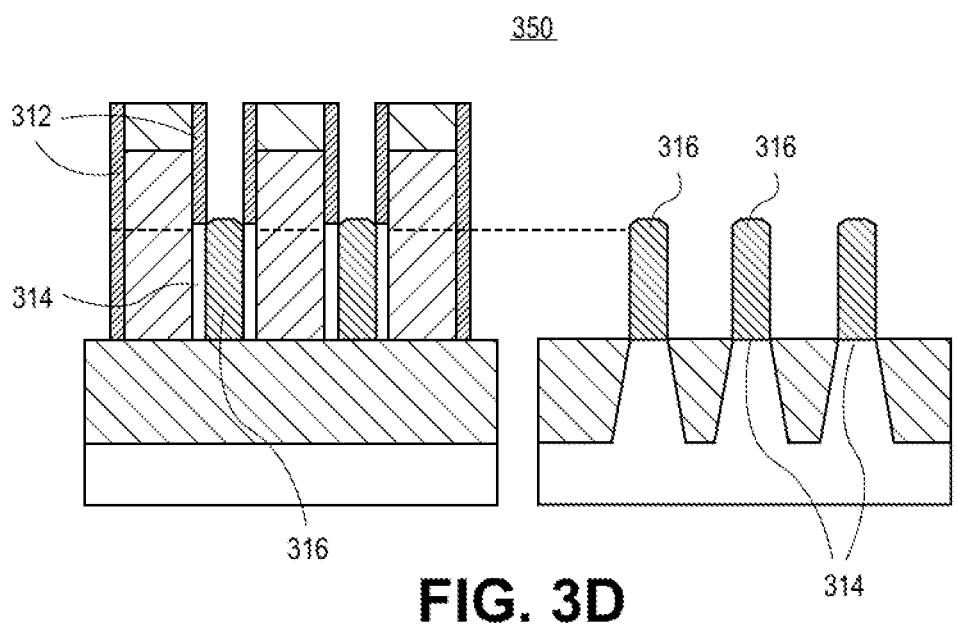

Referring to FIG. 3D, the semiconductor device structure of FIG. 3C is shown following removal of the fin spacers. The resulting structure 350 leaves exposed, from the fin end-on perspective, all surfaces of the confined epitaxial source/drain regions 316. Although not depicted, the structure 350 may be used as a foundation for device fabrication completion, which may include formation of a contact metal and interconnect structure on the confined epitaxial source/drain regions 316.

Referring again to FIGS. 3A-3D in general, in accordance with an embodiment of the present invention, a confined epitaxial growth process can also be used to enable strain engineering incorporation by embedding selective source/drain epitaxial materials at scaled fin pitch without source/drain epi-to-epi shorting. For example, a confined epitaxial silicon germanium region may be formed in source/drain regions of an undercut silicon fin of a PMOS device to provide compressive strain and enhance hole mobility in the channel. In another example, a confined epitaxial carbon-doped silicon region may be formed in source/drain regions of an undercut silicon fin of an NMOS device to provide tensile strain and enhance electron mobility in the channel. Furthermore, a confined epitaxial growth process can also be used to minimize REXT by maximizing contact area. Thus, performance impact may be minimized while meeting the scaling requirements for new technologies.

Referring again to FIG. 3D, the confined epitaxial source/drain regions 316 are "totally" confined ("confined epi") in that there is no to little epitaxial laterally over the shallow trench isolation region 306. This total conferment is achieved by having the fin spacers 313 set at the width of the original fin width, confining the epitaxial growth to the original fin width. However, in accordance with other embodiments described herein, and as described in greater detail below in association with FIG. 7E, the confined epitaxial regions may be extended over a portion of the trench isolation region 306 without contacting to or merging with adjacent epitaxial regions. The latter situation may be referred to as "extended confined epi."

Figure 4A:
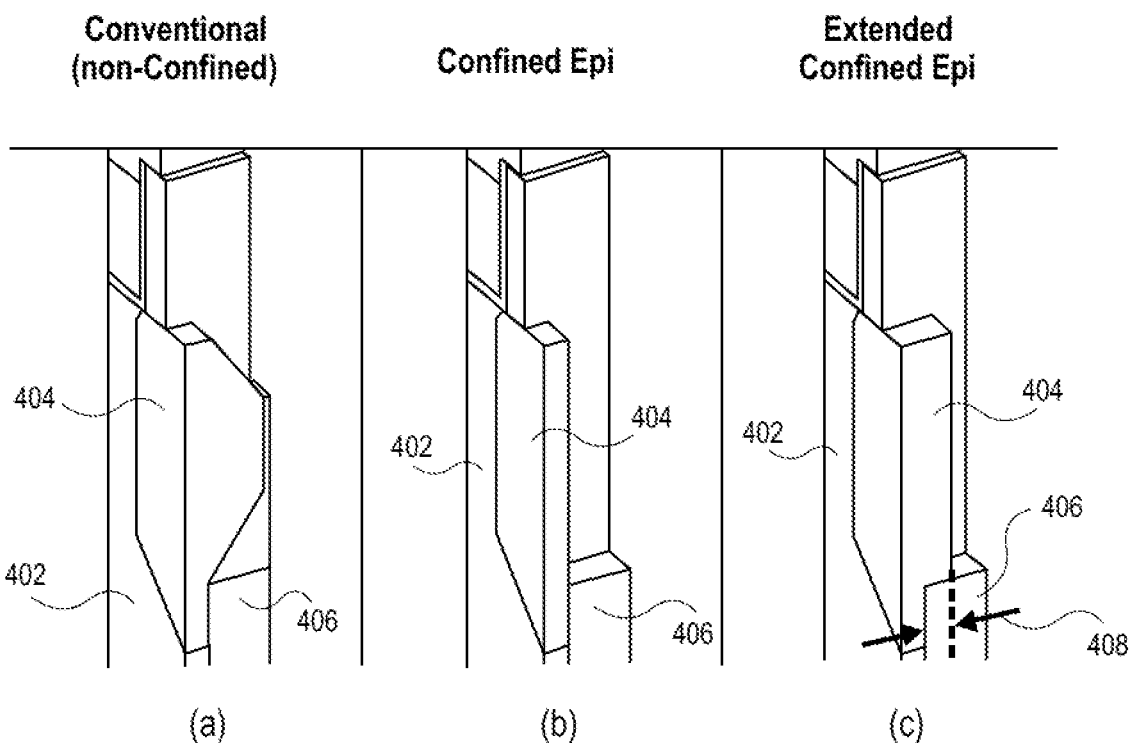
FIG. 4A illustrates TCAD simulation structures of (a) a conventional epitaxial source/drain region, (b) a confined epitaxial source/drain region (confined epi), and (c) an extended confined epitaxial source/drain region (extended confined epi), in accordance with an embodiment of the present invention.

As a demonstration of the channel stressing ability of confined epitaxial source drain regions, FIG. 4A illustrates TCAD simulation structures of (a) a conventional epitaxial source/drain region, (b) a confined epitaxial source/drain region (confined epi), and (c) an extended confined epitaxial source/drain region (extended confined epi), in accordance with an embodiment of the present invention. Referring to FIG. 4A, an undercut fin 402, a source drain region 404 and a shallow trench isolation structure 406 are depicted for each of (a) a conventional epitaxial source/drain region, (b) a confined epi source/drain region, and (c) an extended confined epi source/drain region. For (c), the extent of lateral extension over the shallow trench isolation structure 406 is indicated by the arrows 408 in FIG. 4A.

Figure 4B:
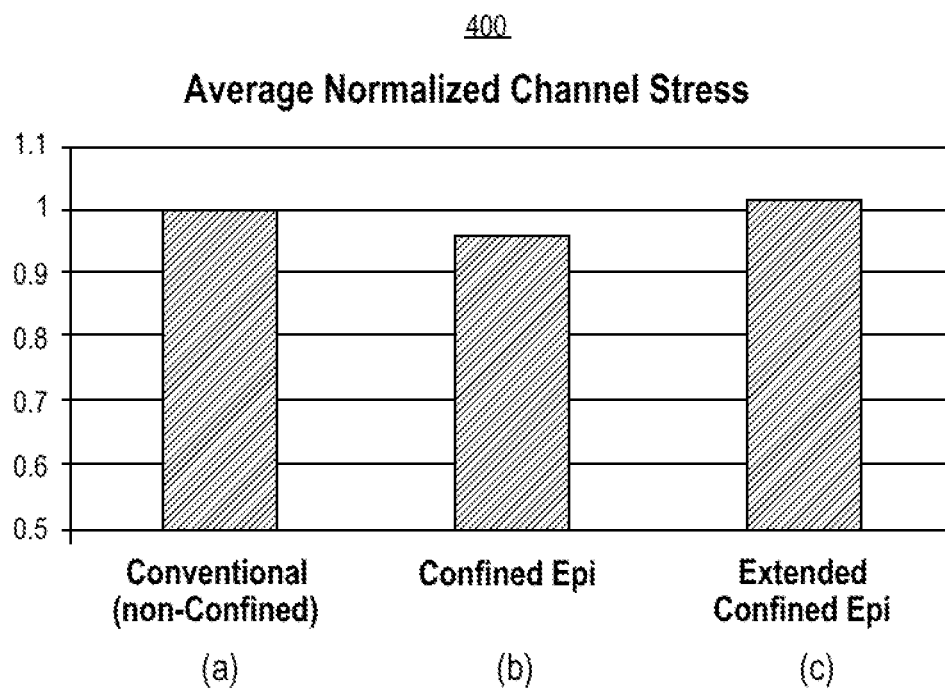
FIG. 4B is a Table showing average normalized channel stress for (a) the conventional epitaxial source/drain region, (b) the confined epitaxial source/drain region (confined epi), and (c) the extended confined epitaxial source/drain region (extended confined epi) of FIG. 4A, in accordance with an embodiment of the present invention.

FIG. 4B is a Table 400 showing average normalized channel stress for (a) the conventional epitaxial source/drain region, (b) the confined epitaxial source/drain region (confined epi), and (c) the extended confined epitaxial source/drain region (extended confined epi) of FIG. 4A, in accordance with an embodiment of the present invention. Referring to Table 400, a TCAD simulation of channel stress demonstrated comparable channel stress from confined epi (approximately 0.96x) and extended confined epi (approximately 1.2x) to the conventional non-confined EUC epi.

Figures 5, 6A:
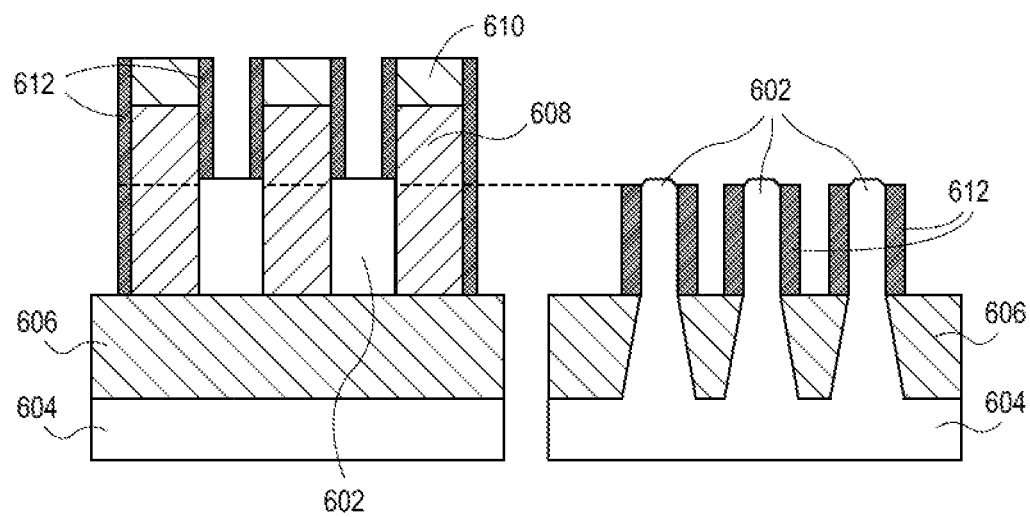
FIG. 5 is a Table showing external resistance (REXT) comparisons between various epitaxial regions for various fin dimensions, in accordance with an embodiment of the present invention.
FIGS. 6A-6E illustrate pairings of side-on and end on cross-sectional views of various operations in another method of fabricating non-planar semiconductor devices having confined epitaxial source/drain regions, with fin side-on views shown on the left-hand side and fin end-on views shown on the right-hand side, in accordance with an embodiment of the present invention, where.

FIG. 5 is a Table 500 showing external resistance (REXT) comparisons between various epitaxial regions for various fin dimensions, in accordance with an embodiment of the present invention. Referring to Table 500, the first column varies fin pitch (ZPV) at 40 nm, 30 nm, and 20 nm. The second column indicates that fin height (HSi) is maintained at 60 nm. The third column indicates that fin width (WSi) is maintained at 6 nm. The fourth column of Table 500 shows the REXT ratio comparison of a fully merged epitaxial region as compared to confined epitaxial regions for varying fin pitch. The fifth column of Table 500 shows the REXT ratio comparison of a barely merged (in-contact) epitaxial region as compared to confined epitaxial regions for varying fin pitch. In general, Table 500 reveals that for trigate transistors with fin height-to-fin pitch (HSi:ZPV) ratio greater than two, the REXT of confined epi is reduced over 80% in comparison to a fully merged non-confined epi case.

Referring again to FIGS. 3A-3D, the associated processing approach described therewith can be described as a confined epi process using fin spacers as barriers. Fin spacers are retained through EUC etch and are used to confine structures to restrict lateral epitaxial growth. The process involves minimization of a fin spacer etch to maintain fin spacers as tall as the fins through EUC. The process also involves use of an anisotropic fin spacer removal etch post epitaxial growth to selectively remove the fin spacers without damaging the epitaxial material and gate hardmask or helmet.

It is to be appreciated that approaches other than the approach described in association with FIGS. 3A-3D can be used to fabricate confined epitaxial source/drain structures, and addition three of which are described in greater detail below. However, each flow is typically associated with key aspects such as, (1) the building of barriers on a fin edge that are resistant to EUC etch, (2) the depositing of epitaxial material selectively inside the barriers, and (3) the subsequent removing of the barrier selectively from the epitaxial edges.

In another aspect, a confined epitaxial source/drain region fabrication scheme utilizes a disposable spacer as the barrier for lateral epitaxial growth. For example, FIGS. 6A-6E illustrate pairings of side-on and end on cross-sectional views of various operations in another method of fabricating non-planar semiconductor devices having confined epitaxial source/drain regions, with fin side-on views shown on the left-hand side (gate cut through fin side view) and fin end-on views shown on the right-hand side (fin cut through source/drain side view), in accordance with an embodiment of the present invention.

Referring to FIG. 6A, a semiconductor device structure 600 is shown following fin formation, gate electrode formation, and disposable spacer formation. In particular, three semiconductor fins 602 are shown protruding from a bulk semiconductor substrate 604, through a shallow trench isolation region 606. Three gate structures 608 (shown having hardmask caps 610 thereon) are formed over the semiconductor fins 602. Disposable spacers 612 are also depicted. The disposable spacers 612 are formed along gate sidewalls as well as along fin sidewalls. It is to be appreciated that in the fin end-on view, the view is taken at the source/drain region locations, so the gate structures are not shown in this view.

Figure 6B:
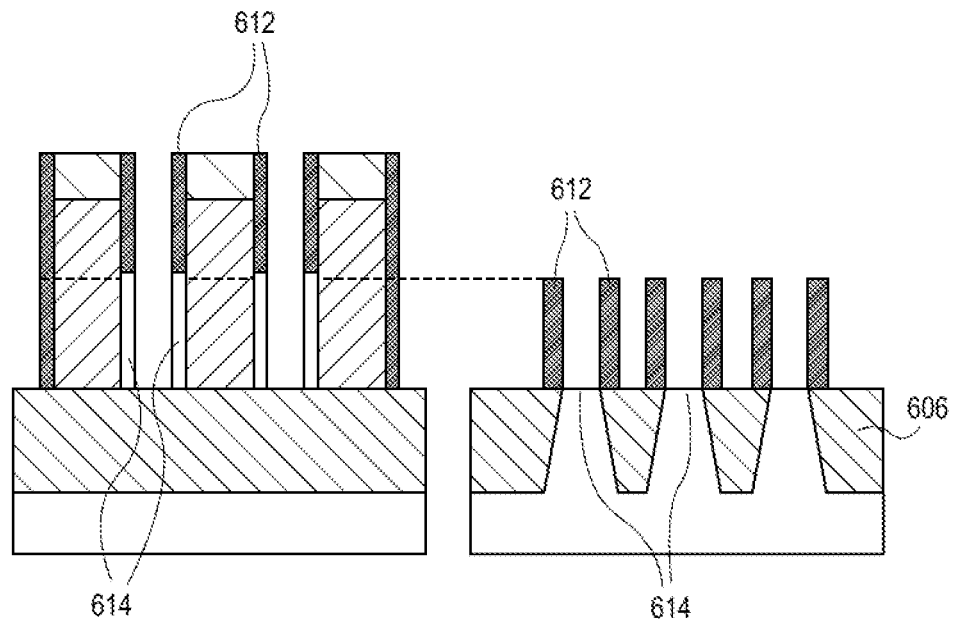

Referring to FIG. 6B, the semiconductor device structure of FIG. 6A is shown following epitaxial undercut (EUC) to remove source/drain regions of the fins 602. In particular, regions of the fins 602 that are exposed at the fin ends, between disposable spacers 612, as well as regions exposed between disposable gate spacers 612 are removed to provide undercut fins 614. The EUC process is selective to the disposable spacer material and, accordingly, the disposable spacers 612 remain standing, as depicted in FIG. 6B. It is to be appreciated that although the extent of EUC is shown as providing undercut fins having a same height as the height of the shallow trench isolation region 606, the EUC process can also be used to provide undercut fins that are etched to some extent below the height of the shallow trench isolation region 606, or the etch may be terminated to leave some portion of the undercut fins above the height of the height of the shallow trench isolation region 606.

Figure 6C:
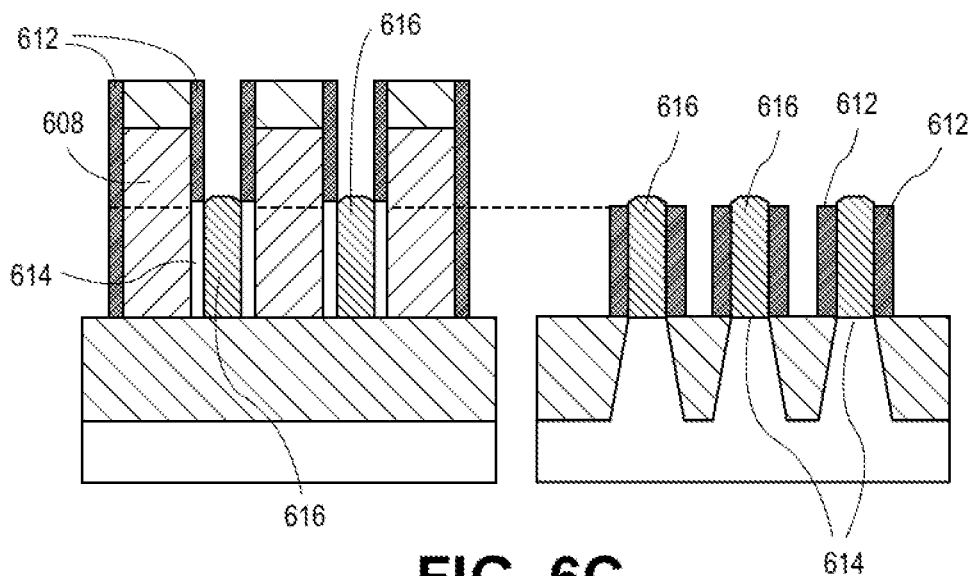

Referring to FIG. 6C, the semiconductor device structure of FIG. 6B is shown following epitaxial growth at the locations where fin material was removed. In particular, semiconductor material regions 616 are grown epitaxially at source/drain regions of the undercut fins 614. As shown on the left-hand side of FIG. 6C, the epitaxial growth between gate structures 608 is confined in the directions shown. Additionally, as shown on the right-hand side of FIG. 6C, the portions of the disposable spacers 612 along the fin sidewalls prevent merging (and any contact) of the epitaxially grown semiconductor material regions 616 between undercut fins 614, leaving confined epitaxial source/drain regions. It is to be appreciated that although the extent of epitaxial growth is shown as providing confined epitaxial regions having approximately a same height as the height of the height of the original fins, the epitaxial growth process can also be used to provide confined epitaxial regions that are formed to some extent below the height of the original fins, or that are formed to some extent above the height of the original fins.

Figure 6D:
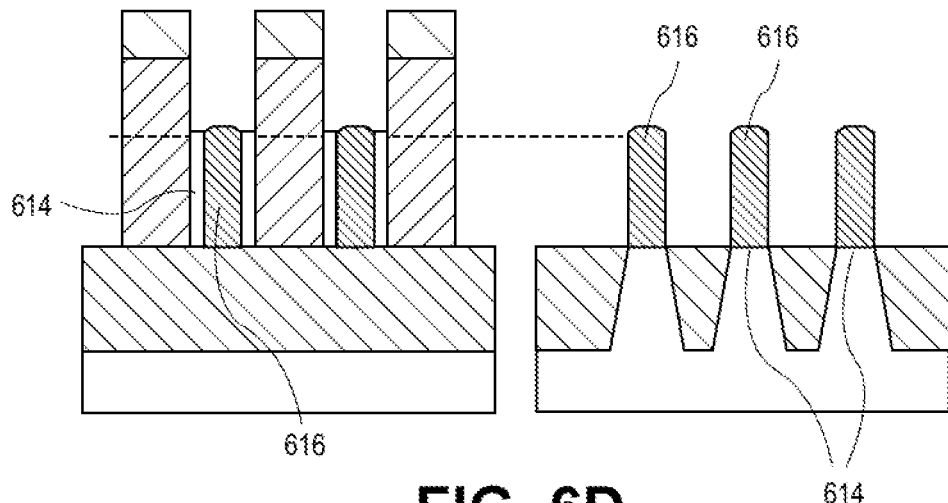

Referring to FIG. 6D, the semiconductor device structure of FIG. 6C is shown following removal of the disposable spacers 612 from both fin and gate sidewalls.

Figure 6E:
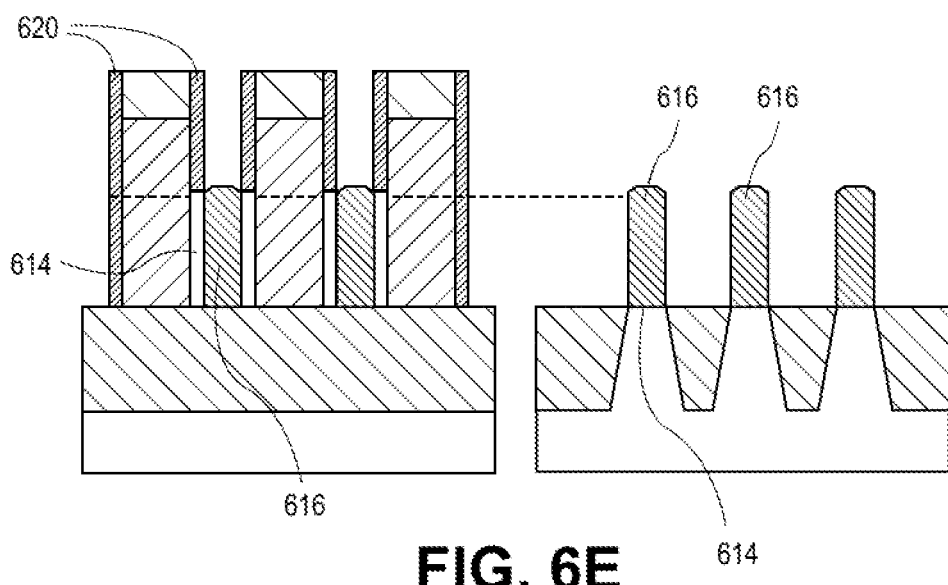

Referring to FIG. 6E, the semiconductor device structure of FIG. 6D is shown following formation of permanent gate spacers 620. Permanent spacer material formed along the sidewalls of the fins is removed. The resulting structure 650 leaves exposed, from the fin end-on perspective, all surfaces of the confined epitaxial source/drain regions 616. Although not depicted, the structure 650 may be used as a foundation for device fabrication completion, which may include formation of a contact metal and interconnect structure on the confined epitaxial source/drain regions 616.

Referring again to FIGS. 6A-6E, the associated processing approach described therewith involves complete removal of a disposable spacer following epitaxial material deposition. In one such embodiment, the disposable spacer is completely removed by a wet etch that is selective to the epi. The process involves gate spacer formation after epi deposition. Thus, a spacer helmet integrated process and an anisotropic fin spacer removal etch that can selectively remove the fin spacers without damaging epi and gate helmet may be implemented.

In another aspect, an extended confined epitaxial source/drain region fabrication scheme utilizes a double spacer as the barrier for lateral epitaxial growth. For example, FIGS. 7A-7E illustrate pairings of side-on and end on cross-sectional views of various operations in another method of fabricating non-planar semiconductor devices having confined epitaxial source/drain regions, with fin side-on views shown on the left-hand side (gate cut through fin side view) and fin end-on views shown on the right-hand side (fin cut through source/drain side view), in accordance with an embodiment of the present invention.

Figure 7A:
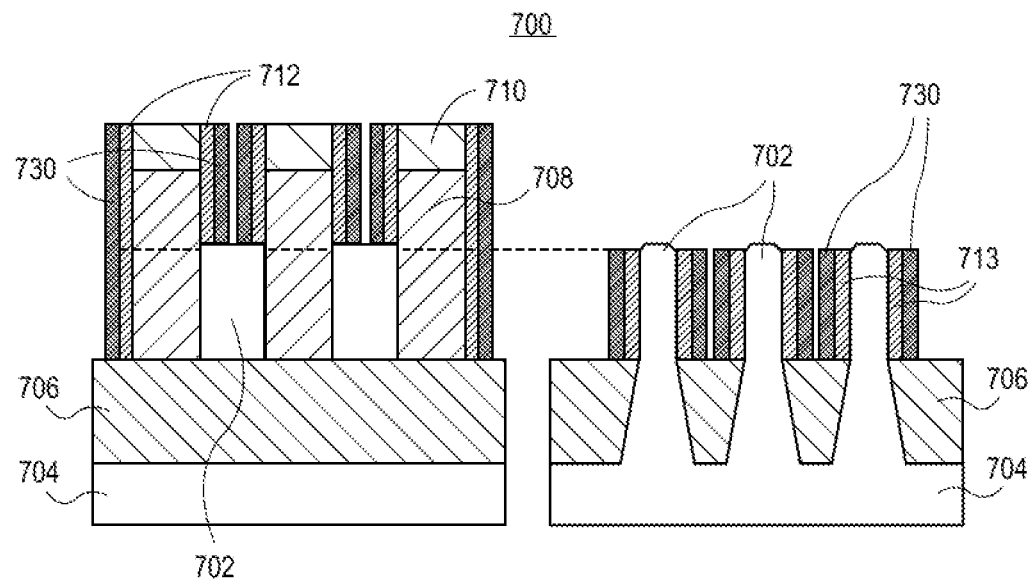
FIGS. 7A-7E illustrate pairings of side-on and end on cross-sectional views of various operations in another method of fabricating non-planar semiconductor devices having confined epitaxial source/drain regions, with fin side-on views shown on the left-hand side and fin end-on views shown on the right-hand side, in accordance with an embodiment of the present invention, where.

Referring to FIG. 7A, a semiconductor device structure 700 is shown following fin formation, gate electrode formation, and double spacer formation. In particular, three semiconductor fins 702 are shown protruding from a bulk semiconductor substrate 704, through a shallow trench isolation region 706. Three gate structures 708 (shown having hardmask caps 710 thereon) are formed over the semiconductor fins 702. Gate spacers 712 are also depicted. In contrast to the structure 200 of FIG. 2A, the structure 700 of FIG. 7A is not subjected to spacer removal from the sides of the fins 702. As such, as seen in the fin end-on view, fin spacers 713 remain. Additionally, disposable spacers 730 are also formed along the sidewalls of the gate spacers 712 and fin spacers 713. It is to be appreciated that in the fin end-on view, the view is taken at the source/drain region locations, so the gate structures are not shown in this view.

Figure 7B:
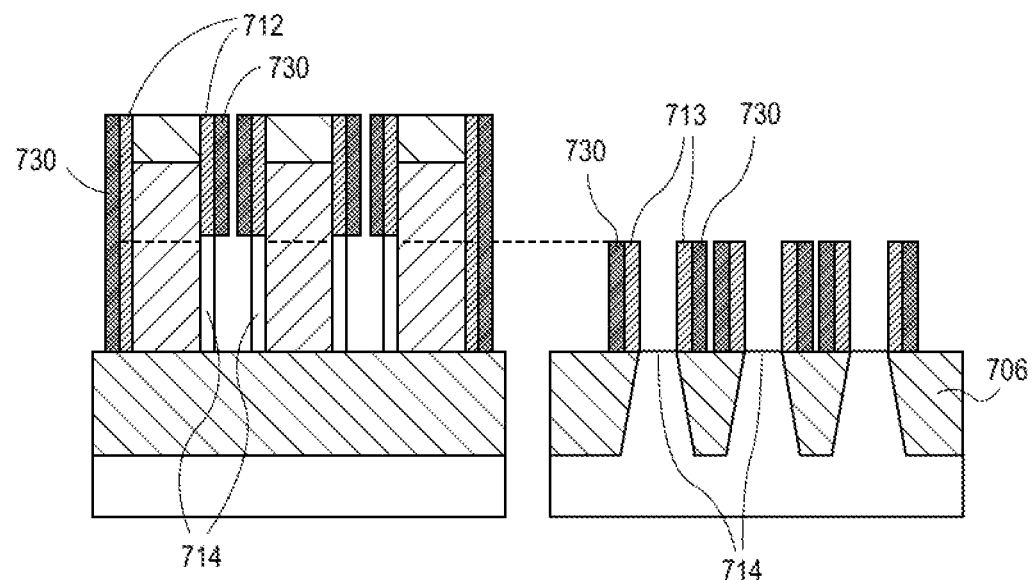

Referring to FIG. 7B, the semiconductor device structure of FIG. 7A is shown following epitaxial undercut (EUC) to remove source/drain regions of the fins 702. In particular, regions of the fins 702 that are exposed at the fin ends as well as regions exposed between gate spacers 712 are removed to provide undercut fins 714. The EUC process is selective to the gate and fin spacer material as well as to the disposable spacer material and, accordingly, the gate spacers 712, fin spacers 713 and disposable spacers 730 remain standing, as depicted in FIG. 7B. It is to be appreciated that although the extent of EUC is shown as providing undercut fins having a same height as the height of the shallow trench isolation region 706, the EUC process can also be used to provide undercut fins that are etched to some extent below the height of the shallow trench isolation region 706, or the etch may be terminated to leave some portion of the undercut fins above the height of the height of the shallow trench isolation region 706.

Figure 7C:
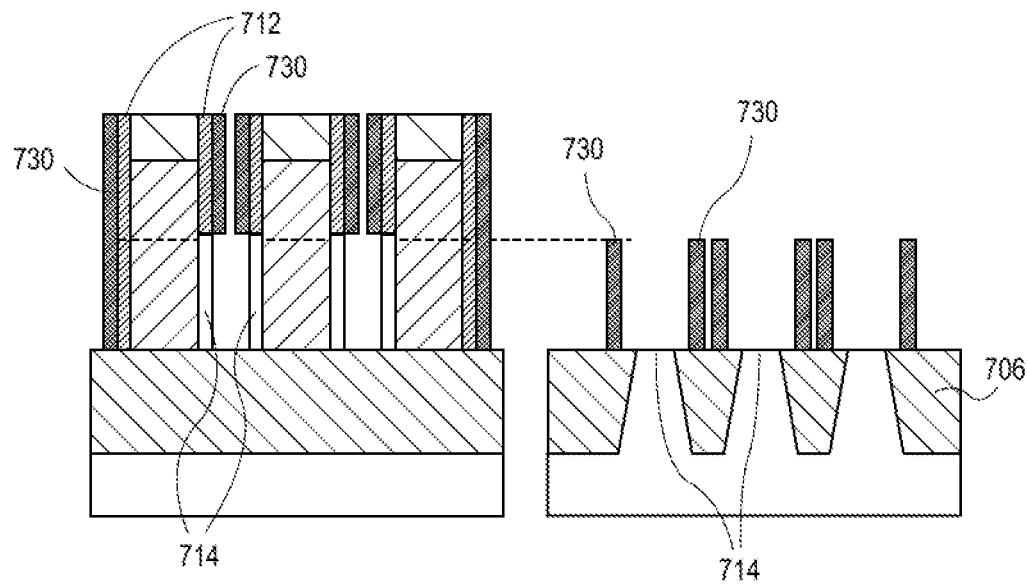

Referring to FIG. 7C, the fin spacers 713 are removed from the structure of FIG. 7B, leaving the disposable spacers 730 to remain at the fin locations. In an embodiment, removal of the fin spacers 713 exposes a portion of the top surface of the shallow trench isolation structure 706, as is depicted in FIG. 7C.

Figure 7D:
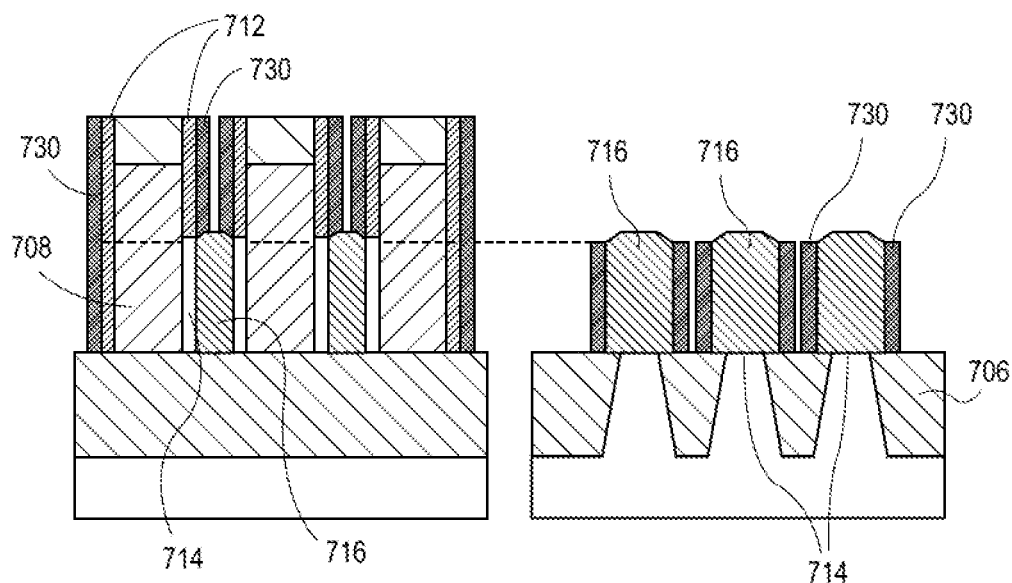

Referring to FIG. 7D, the semiconductor device structure of FIG. 7C is shown following epitaxial growth at the locations where fin material was removed. In particular, semiconductor material regions 716 are grown epitaxially at source/drain regions of the undercut fins 714. As shown on the left-hand side of FIG. 7D, the epitaxial growth between gate structures 708 is confined in the directions shown. Additionally, as shown on the right-hand side of FIG. 7D, the portions of the disposable spacers 730 along the fin sidewalls prevent merging (and any contact) of the epitaxially grown semiconductor material regions 716 between undercut fins 714, leaving confined epitaxial source/drain regions. However, in contrast to the structures associated with FIGS. 3A-3D and FIGS. 7A-7E, the confined epitaxial source/drain regions are extended confined epitaxial source/drain regions since a controlled amount of lateral growth occurs over the top surface of the shallow trench isolation structure 706. The extended growth is permitted since the fin spacers 713 were removed, opening the region for epitaxial growth in a lateral direction. It is to be appreciated that although the extent of epitaxial growth is shown as providing confined epitaxial regions having approximately a same height as the height of the height of the original fins, the epitaxial growth process can also be used to provide confined epitaxial regions that are formed to some extent below the height of the original fins, or that are formed to some extent above the height of the original fins.

Figure 7E:
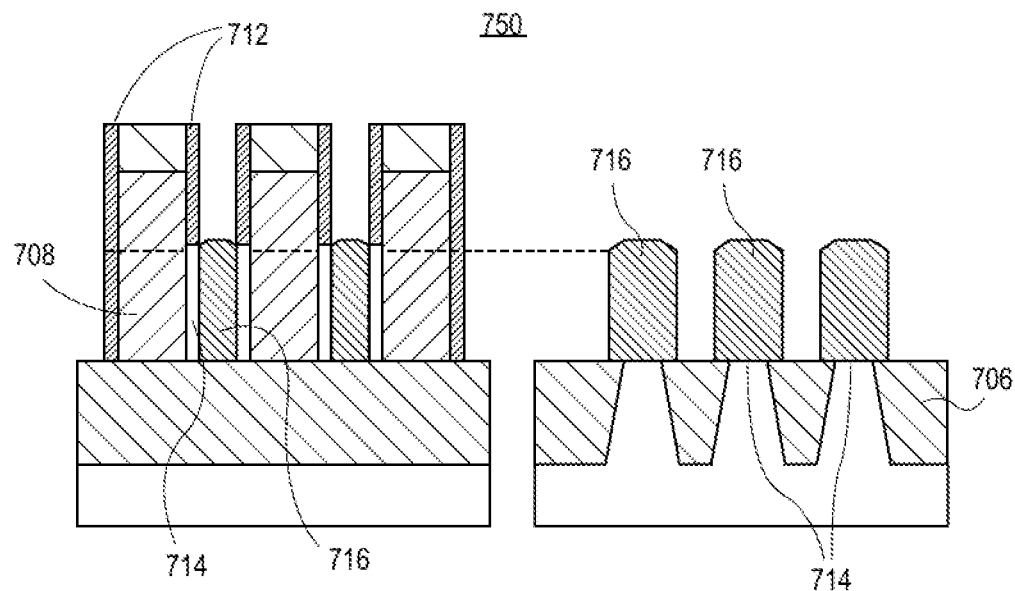

Referring to FIG. 7E, the semiconductor device structure of FIG. 7D is shown following removal of the disposable spacers 730 from both fin and gate sidewalls. The removal leaves only the gate spacers 712 to remain. The resulting structure 750 leaves exposed, from the fin end-on perspective, all surfaces of the confined extended epitaxial source/drain regions 716. Although not depicted, the structure 750 may be used as a foundation for device fabrication completion, which may include formation of a contact metal and interconnect structure on the confined epitaxial source/drain regions 716.

Referring again to FIGS. 7A-7E, the associated processing approach described therewith involves increasing the size of the epi regions in a lateral direction over the surface if of isolation regions. In one embodiment, as depicted, the process involves deposition of disposable spacers that wrap around the gate and fin spacer. An anisotropic dry etch is used to break through the double spacers above the top of fin. An EUC etch is subsequently performed. Following EUC etch, a gate helmet integrated anisotropic etch is applied to remove the fin spacers from inside the EUC trenches, thus providing larger room for epi growth. An isotropic etch can be utilized to remove the fin spacers to create larger room for epi growth. After epi growth, the disposable spacer is completely removed by a wet etch that is selective to the epi and the gate spacer.

In another aspect, confined epitaxial source/drain regions are fabricated using dielectric blocks as barriers. For example, FIGS. 8A-8E illustrate pairings of side-on and end on cross-sectional views of various operations in another method of fabricating non-planar semiconductor devices having confined epitaxial source/drain regions, with fin side-on views shown on the left-hand side (gate cut through fin side view) and fin end-on views shown on the right-hand side (fin cut through source/drain side view), in accordance with an embodiment of the present invention.

Figure 8A:
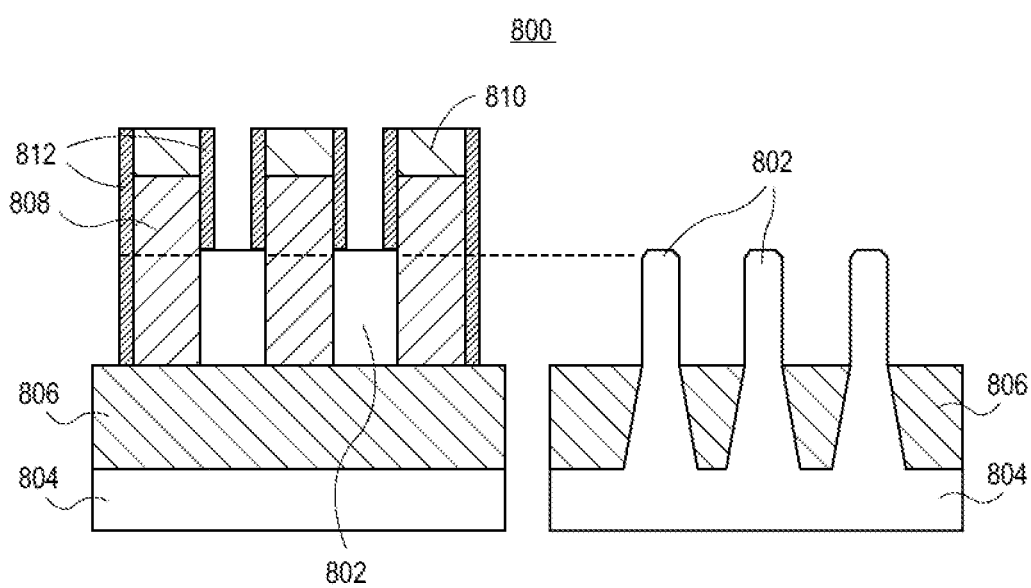
FIGS. 8A-8E illustrate pairings of side-on and end on cross-sectional views of various operations in another method of fabricating non-planar semiconductor devices having confined epitaxial source/drain regions, with fin side-on views shown on the left-hand side and fin end-on views shown on the right-hand side, in accordance with an embodiment of the present invention, where.

Referring to FIG. 8A, a semiconductor device structure 800 is shown following fin formation, gate electrode formation, and gate spacer formation. In particular, three semiconductor fins 802 are shown protruding from a bulk semiconductor substrate 804, through a shallow trench isolation region 806. Three gate structures 808 (shown having hardmask caps 810 thereon) are formed over the semiconductor fins 802. Gate spacers 812 are also depicted. In contrast to the structure 300 of FIG. 3A, the structure 800 of FIG. 8A is subjected to spacer removal from the sides of the fins 802. As such, as seen in the fin end-on view, fin spacers do not remain. It is to be appreciated that in the fin end-on view, the view is taken at the source/drain region locations, so the gate structures are not shown in this view.

Figure 8B:
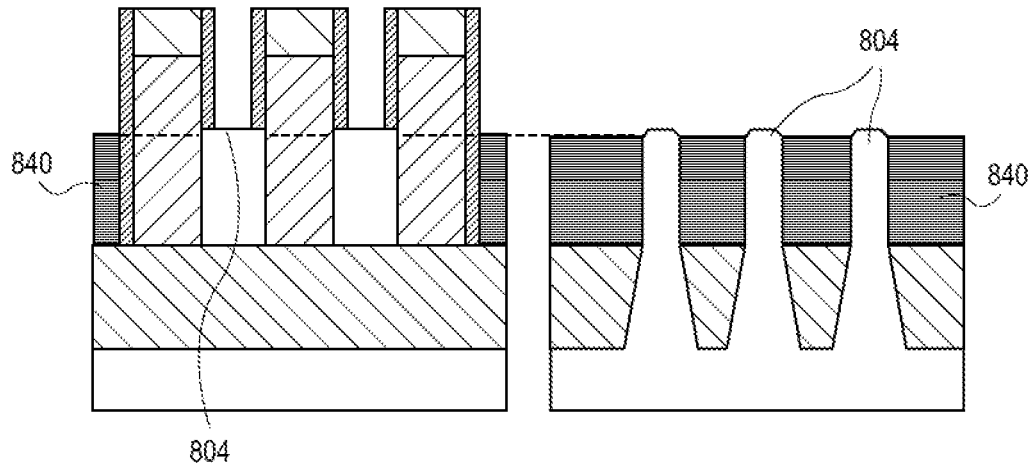

Referring to FIG. 8B, the semiconductor device structure of FIG. 8A is shown following a dielectric block deposition. In particular, a dielectric layer 840 is formed on exposed regions between fins 804. In one such embodiment, the dielectric layer is formed to approximately the same height as, or slightly recessed below, the top surface of the fins 804. In an embodiment, the dielectric layer is composed of a material such as, but not limited to, a flowable oxide or a high temperature amorphous carbon (carbon-based hardmask).

Figure 8C:
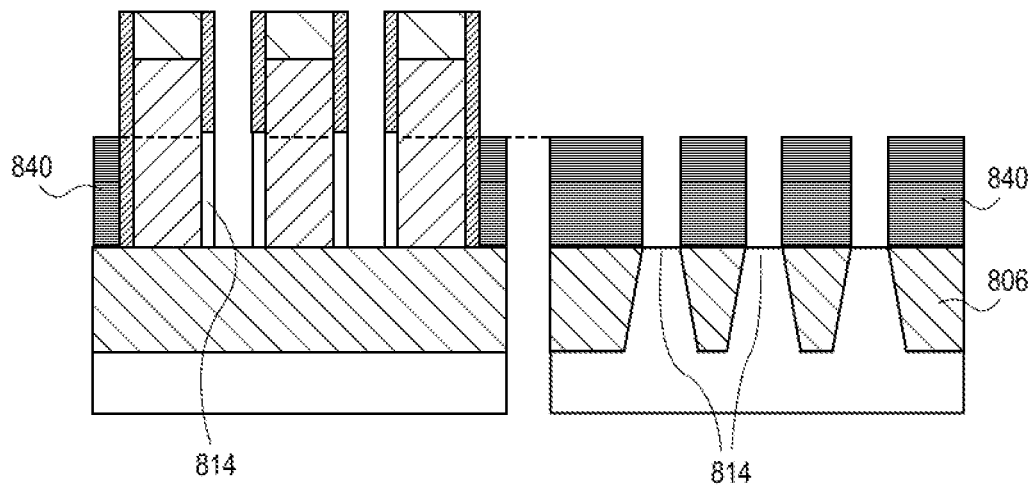

Referring to FIG. 8C, the semiconductor device structure of FIG. 8B is shown following epitaxial undercut (EUC) to remove source/drain regions of the fins 802. In particular, regions of the fins 802 that are exposed at the fin ends as well as regions exposed between gate spacers 812 are removed to provide undercut fins 814. The EUC process is selective to the spacer 812 material and to the dielectric layer 840, as depicted in FIG. 8C. It is to be appreciated that although the extent of EUC is shown as providing undercut fins having a same height as the height of the shallow trench isolation region 806, the EUC process can also be used to provide undercut fins that are etched to some extent below the height of the shallow trench isolation region 806, or the etch may be terminated to leave some portion of the undercut fins above the height of the height of the shallow trench isolation region 806.

Figure 8D:
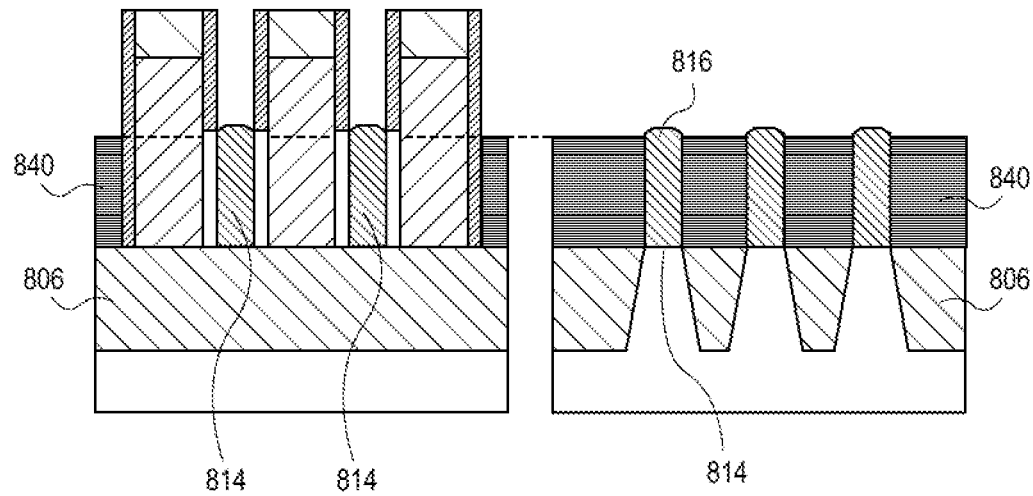

Referring to FIG. 8D, the semiconductor device structure of FIG. 8C is shown following epitaxial growth at the locations where fin material was removed. In particular, semiconductor material regions 816 are grown epitaxially at source/drain regions of the undercut fins 814. As shown on the left-hand side of FIG. 8C, the epitaxial growth between gate structures 808 is confined in the directions shown. Additionally, as shown on the right-hand side of FIG. 8C, the dielectric layer 840 prevents merging (and any contact) of the epitaxially grown semiconductor material regions 816 between undercut fins 814, leaving confined epitaxial source/drain regions. It is to be appreciated that although the extent of epitaxial growth is shown as providing confined epitaxial regions having approximately a same height as the height of the height of the original fins, the epitaxial growth process can also be used to provide confined epitaxial regions that are formed to some extent below the height of the original fins, or that are formed to some extent above the height of the original fins.

Figure 8E:
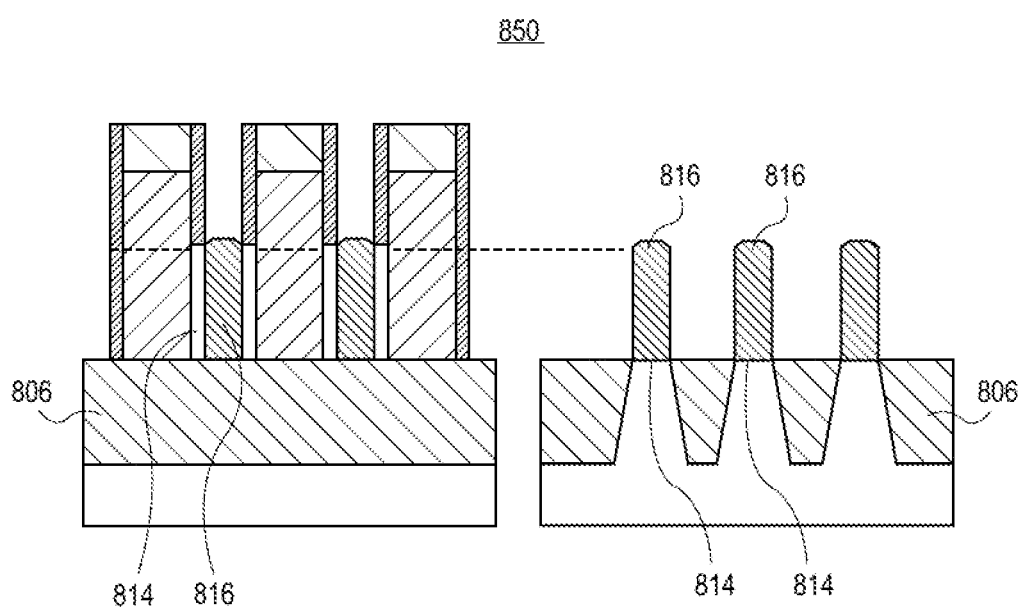

Referring to FIG. 8E, the semiconductor device structure of FIG. 8D is shown following removal of the dielectric layer 840. The resulting structure 850 leaves exposed, from the fin end-on perspective, all surfaces of the confined epitaxial source/drain regions 816. Although not depicted, the structure 850 may be used as a foundation for device fabrication completion, which may include formation of a contact metal and interconnect structure on the confined epitaxial source/drain regions 816.

Referring again to FIGS. 8A-8E, the associated processing approach described therewith involves filling of all gaps between gates and fins with a dielectric material after fin spacer removal. The dielectric material is then recessed directly below the fin tops for EUC to remove fin. The materials used have high etch selectivity against the EUC etch and are compatible with epitaxial growth. Post EUC and epitaxial growth, the blocking material may be selectively removed by wet etch, dry etch or ash process.

In general, referring again to FIGS. 3A-3D, 6A-6E, 7A-7E and 8A-8E, in an embodiment, the confined epitaxial source/drain regions formation can be applicable for N-type and P-type devices. It is to be understood that the structures resulting from the above exemplary processing schemes, e.g., structures from FIGS. 3D, 6E, 7E and 8E, may be used in a same or similar form for subsequent processing operations to complete device fabrication, such as PMOS and NMOS device fabrication. As an example of a completed device, FIGS. 9A and 9B illustrate a cross-sectional view and a plan view (taken along the a-a' axis of the cross-sectional view), respectively, of a non-planar semiconductor device having fins with confined epitaxial source/drain regions, in accordance with an embodiment of the present invention.

Figure 9A:
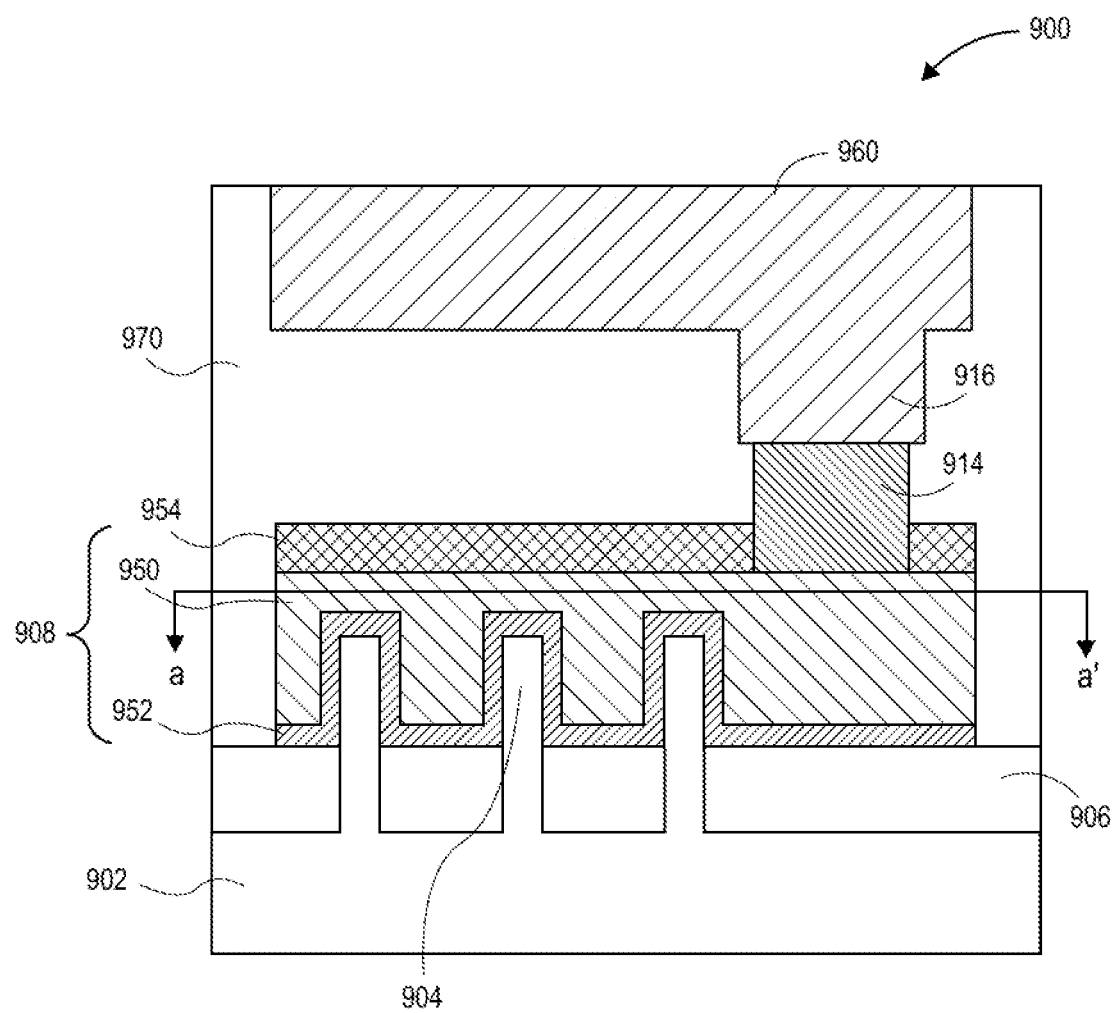
FIG. 9A illustrates a cross-sectional view of a non-planar semiconductor device having fins with confined epitaxial source/drain regions, in accordance with an embodiment of the present invention.

Referring to FIG. 9A, a semiconductor structure or device 900 includes a non-planar active region (e.g., a fin structure including protruding fin portion 904) formed from substrate 902, and above isolation region 906. A gate line 908 is disposed over the protruding portions 904 of the non-planar active region as well as over a portion of the isolation region 906. As shown, gate line 908 includes a gate electrode 950 and a gate dielectric layer 952. In one embodiment, gate line 908 may also include a dielectric cap layer 954. A gate contact 914, and overlying gate contact via 916 are also seen from this perspective, along with an overlying metal interconnect 960, all of which are disposed in inter-layer dielectric stacks or layers 970. Also seen from the perspective of FIG. 9A, the gate contact 914 is, in one embodiment, disposed over isolation region 906, but not over the non-planar active regions.

Figure 9B:
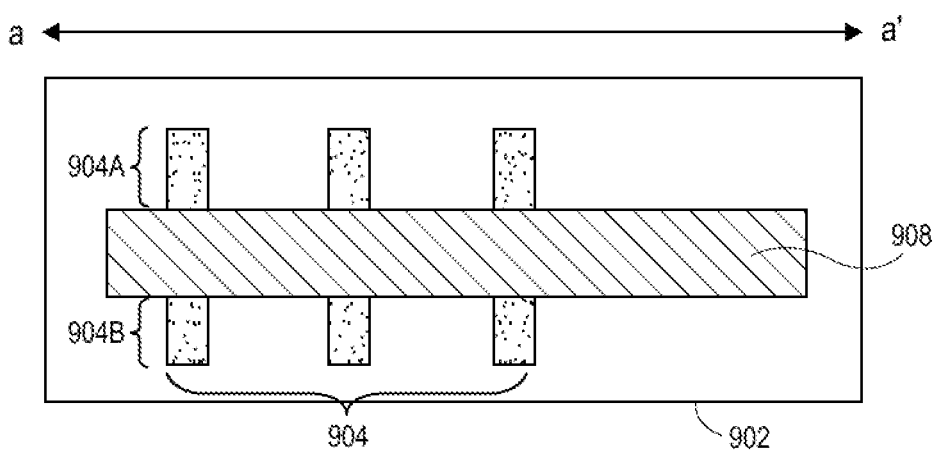
FIG. 9B illustrates a plan view taken along the a-a' axis of the semiconductor device of FIG. 9A, in accordance with an embodiment of the present invention.

Referring to FIG. 9B, the gate line 908 is shown as disposed over the protruding fin portions 904. Source and drain regions 904A and 904B of the protruding fin portions 904 can be seen from this perspective. In one embodiment, the material of the protruding fin portions 904 is removed (undercut) and replaced with another semiconductor material, e.g., by epitaxial deposition, as described above. In a specific embodiment, the source and drain regions 904A and 904B may extend below the height of dielectric layer 906, but they may instead be level with or above the dielectric layer 906. In an embodiment, the source and drain regions 904A and 904B are formed by a deposition process such as, but not limited to, chemical vapor deposition (CVD), atomic layer deposition (ALD), or molecular beam epitaxy (MBE). In one embodiment, the source and drain regions 904A and 904B are in situ doped with impurity atoms. In one embodiment, the source and drain regions 904A and 904B are doped with impurity atoms subsequent to formation. In one embodiment, the source and drain regions 904A and 904B are in situ doped with impurity atoms and further doped subsequent to formation. It is to be appreciated that the source and drain regions 904A and 904B may be composed of a like or different semiconductor material as compared the semiconductor material of the protruding fin portions 904.

In an embodiment, the semiconductor structure or device 900 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 908 surround at least a top surface and a pair of sidewalls of the three-dimensional body.

Substrate 902 may be composed of a semiconductor material that can withstand a manufacturing process and in which charge can migrate. In an embodiment, substrate 902 is a bulk substrate composed of a crystalline silicon, silicon/germanium or germanium layer doped with a charge carrier, such as but not limited to phosphorus, arsenic, boron or a combination thereof, to form active region 904. In one embodiment, the concentration of silicon atoms in bulk substrate 902 is greater than 97%. In another embodiment, bulk substrate 902 is composed of an epitaxial layer grown atop a distinct crystalline substrate, e.g. a silicon epitaxial layer grown atop a boron-doped bulk silicon mono-crystalline substrate. Bulk substrate 902 may alternatively be composed of a group III-V material. In an embodiment, bulk substrate 902 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 902 is composed of a III-V material and the charge-carrier dopant impurity atoms are ones such as, but not limited to, carbon, silicon, germanium, oxygen, sulfur, selenium or tellurium.

Isolation region 906 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 906 is composed of a dielectric material such as, but not limited to, silicon dioxide, silicon oxy-nitride, silicon nitride, or carbon-doped silicon nitride.

Gate line 908 may be composed of a gate electrode stack which includes a gate dielectric layer 952 and a gate electrode layer 950. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 902. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 914 and overlying gate contact via 916 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 900 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 908 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 900. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 9A, the arrangement of semiconductor structure or device 900 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node. Embodiments herein may be applicable for improving transistor layout density and for mitigating trends toward increases in contact resistance.

Figure 10:
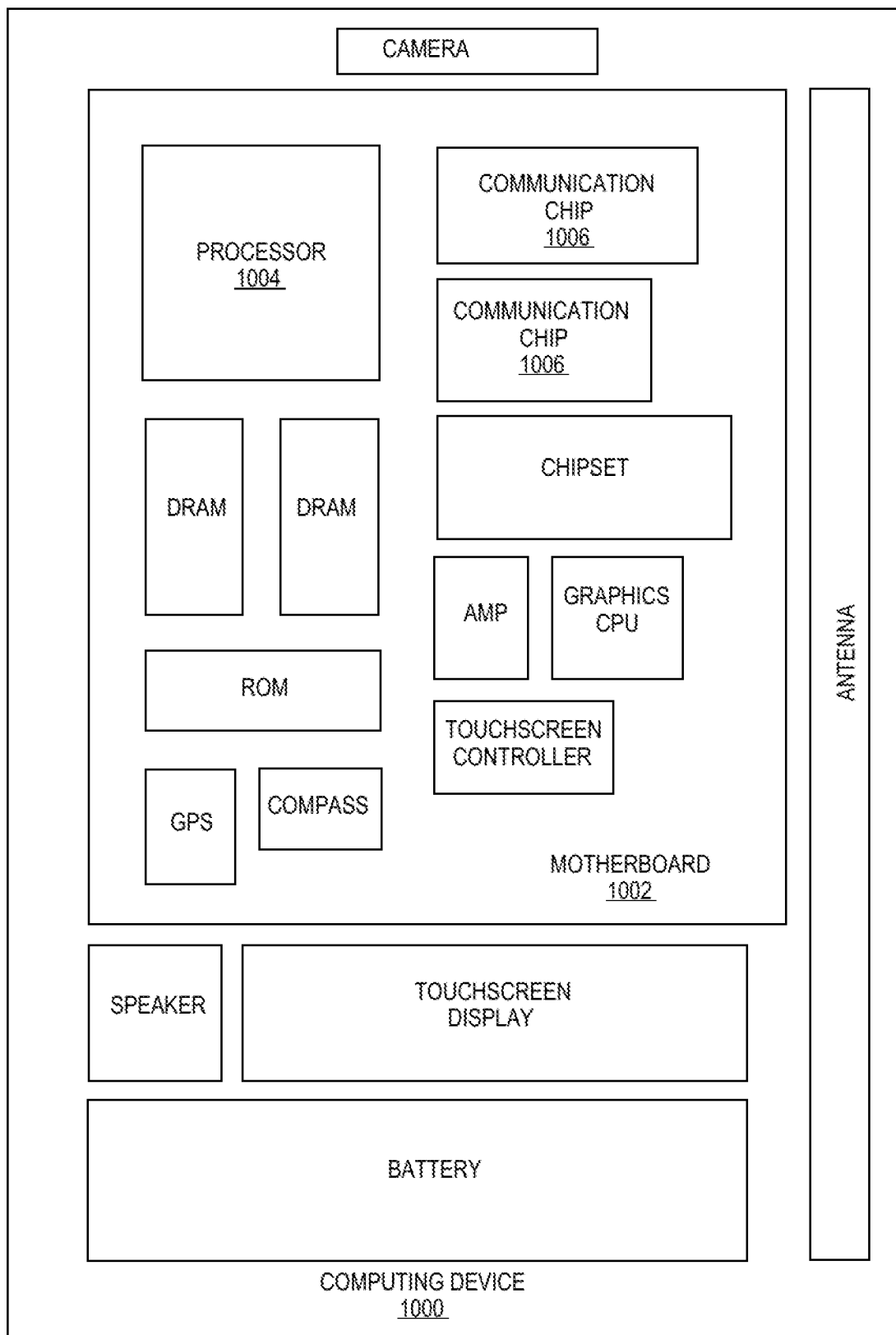
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of embodiments of the invention.

In various embodiments, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments of the present invention include confined epitaxial regions for semiconductor devices and methods of fabricating semiconductor devices having confined epitaxial regions.

In an embodiment, a semiconductor structure includes a plurality of parallel semiconductor fins disposed above and continuous with a semiconductor substrate. An isolation structure is disposed above the semiconductor substrate and adjacent to lower portions of each of the plurality of parallel semiconductor fins. An upper portion of each of the plurality of parallel semiconductor fins protrudes above an uppermost surface of the isolation structure. Epitaxial source and drain regions are disposed in each of the plurality of parallel semiconductor fins adjacent to a channel region in the upper portion of the semiconductor fin. The epitaxial source and drain regions do not extend laterally over the isolation structure. The semiconductor structure also includes one or more gate electrodes, each gate electrode disposed over the channel region of one or more of the plurality of parallel semiconductor fins.

In one embodiment, respective source and drain regions of adjacent semiconductor fins are not merged with or in contact with one another.

In one embodiment, the epitaxial source and drain regions are stress inducing for the respective channel region.

In one embodiment, the semiconductor structure further includes a contact metal layer disposed on all surfaces of the epitaxial source and drain regions exposed above the uppermost surface of the isolation structure.

In one embodiment, the epitaxial source and drain regions are composed of a semiconductor material different than a semiconductor material of the channel regions of the plurality of semiconductor fins.

In one embodiment, the epitaxial source and drain regions each have a bottom surface below the uppermost surface of the isolation structure.

In one embodiment, the epitaxial source and drain regions each have a bottom surface approximately planar with the uppermost surface of the isolation structure.

In one embodiment, the epitaxial source and drain regions each have a bottom surface above the uppermost surface of the isolation structure.

In an embodiment, a semiconductor structure includes a plurality of parallel semiconductor fins disposed above and continuous with a semiconductor substrate. An isolation structure is disposed above the semiconductor substrate and adjacent to lower portions of each of the plurality of parallel semiconductor fins. An upper portion of each of the plurality of parallel semiconductor fins protrudes above an uppermost surface of the isolation structure. Epitaxial source and drain regions are disposed in each of the plurality of parallel semiconductor fins adjacent to a channel region in the upper portion of the semiconductor fin. The epitaxial source and drain regions have substantially vertical sidewalls. Respective source and drain regions of adjacent semiconductor fins are not merged with or in contact with one another. The semiconductor structure also includes one or more gate electrodes, each gate electrode disposed over the channel region of one or more of the plurality of parallel semiconductor fins.

In one embodiment, the epitaxial source and drain regions do not extend laterally over the isolation structure.

In one embodiment, the epitaxial source and drain regions extend laterally over the isolation structure.

In one embodiment, the epitaxial source and drain regions are stress inducing for the respective channel region.

In one embodiment, the semiconductor structure further includes a contact metal layer disposed on all surfaces of the epitaxial source and drain regions exposed above the uppermost surface of the isolation structure.

In one embodiment, the epitaxial source and drain regions are composed of a semiconductor material different than a semiconductor material of the channel regions of the plurality of semiconductor fins.

In one embodiment, the epitaxial source and drain regions each have a bottom surface below the uppermost surface of the isolation structure.

In one embodiment, the epitaxial source and drain regions each have a bottom surface approximately planar with the uppermost surface of the isolation structure.

In one embodiment, the epitaxial source and drain regions each have a bottom surface above the uppermost surface of the isolation structure.

In an embodiment, a method of fabricating a semiconductor structure involves forming a plurality of parallel semiconductor fins above and continuous with a semiconductor substrate. The method also involves forming an isolation structure above the semiconductor substrate and adjacent to lower portions of each of the plurality of parallel semiconductor fins. An upper portion of each of the plurality of parallel semiconductor fins protrudes above an uppermost surface of the isolation structure. The method also involves forming one or more gate electrodes, each gate electrode formed over a channel region of one or more of the plurality of parallel semiconductor fins. The method also involves forming epitaxial confining regions along sidewalls of dummy source and drain regions of each of the plurality of parallel semiconductor fins. The method also involves removing the dummy source and drain regions from each of the plurality of parallel semiconductor fins without removing the epitaxial confining regions. The method also involves forming epitaxial source and drain regions in each of the plurality of parallel semiconductor fins adjacent to the channel region in the upper portion of the semiconductor fin, the epitaxial source and drain regions confined by the epitaxial confining regions.

In one embodiment, the method further involves removing the epitaxial confining regions, and forming a contact metal layer on all surfaces of the epitaxial source and drain regions protruding above the isolation structure.

In one embodiment, forming the epitaxial confining regions involves forming double spacers, and the method further involves removing an inner spacer of the epitaxial confining regions prior to forming the epitaxial source and drain regions.

In one embodiment, forming the epitaxial confining regions involves forming single spacers.

In one embodiment, forming the epitaxial confining regions involves forming a block dielectric layer.

In one embodiment, forming the epitaxial source and drain regions involves forming epitaxial source and drain regions that do not extend laterally over the isolation structure.

In one embodiment, forming the epitaxial source and drain regions involves forming epitaxial source and drain regions that extend laterally over the isolation structure.

In one embodiment, the one or more gate electrodes are dummy gate electrodes, and the method further involves, subsequent to forming the epitaxial source and drain regions, replacing the dummy gate electrodes with permanent gate electrodes.

What is claimed is:

1. An integrated circuit structure, comprising:
   a first pair of semiconductor fins, comprising:
      a first semiconductor fin; and
      a second semiconductor fin, the second semiconductor fin spaced apart from the first semiconductor fin by a first fin-to-fin distance;
   a second pair of semiconductor fins, comprising:
      a third semiconductor fin; and
      a fourth semiconductor fin, the fourth semiconductor fin spaced apart from the third semiconductor fin by a second fin-to-fin distance, the second fin-to-fin distance substantially the same as the first fin-to-fin distance;
   a first epitaxial source or drain region on the first semiconductor fin;
   a second epitaxial source or drain region on the second semiconductor fin, wherein the second epitaxial source or drain region is not merged nor in contact with the first epitaxial source or drain region;
   a third epitaxial source or drain region on the third semiconductor fin; and
   a fourth epitaxial source or drain region on the fourth semiconductor fin, wherein the fourth epitaxial source or drain region is merged with the third epitaxial source or drain region.

2. The integrated circuit structure of claim 1, wherein the first epitaxial source or drain region extends laterally beyond the first semiconductor fin, and wherein the second epitaxial source or drain region extends laterally beyond the second semiconductor fin.

3. The integrated circuit structure of claim 1, wherein the first fin-to-fin distance is from a center of a base of the first semiconductor fin to a center of a base of the second semiconductor fin, and wherein the second fin-to-fin distance is from a center of a base of the third semiconductor fin to a center of a base of the fourth semiconductor fin.

4. The integrated circuit structure of claim 1, further comprising:
   a first contact over the first epitaxial source or drain region and the second epitaxial source or drain region; and
   a second contact over the third epitaxial source or drain region and the fourth epitaxial source or drain region.

5. The integrated circuit structure of claim 4, wherein the first contact extends laterally between the first epitaxial source or drain region and the second epitaxial source or drain region.

6. An integrated circuit structure, comprising:
   a first pair of semiconductor fin structures, comprising:
      a first semiconductor fin structure; and
      a second semiconductor fin structure, the first and second semiconductor fin structures being spaced at first fin pitch;
   a second pair of semiconductor fin structures, comprising:
      a third semiconductor fin structure; and
      a fourth semiconductor fin structure, the third and fourth semiconductor fin structures being spaced at a second fin pitch, the second fin pitch substantially the same as the first fin pitch;
   a first source or drain region on the first semiconductor fin structure;
   a second source or drain region on the second semiconductor fin structure, wherein the second source or drain region is not merged nor in contact with the first source or drain region;
   a third source or drain region on the third semiconductor fin structure; and
   a fourth source or drain region on the fourth semiconductor fin structure, wherein the fourth source or drain region is merged with the third source or drain region.

7. The integrated circuit structure of claim 6, wherein the first source or drain region extends laterally beyond the first semiconductor fin structure, and wherein the second source or drain region extends laterally beyond the second semiconductor fin structure.

8. The integrated circuit structure of claim 6, wherein the first fin pitch distance is from a center of a base of the first semiconductor fin structure to a center of a base of the second semiconductor fin structure, and wherein the second fin pitch distance is from a center of a base of the third semiconductor fin structure to a center of a base of the fourth semiconductor fin structure.

9. The integrated circuit structure of claim 6, further comprising:
- a first contact over the first source or drain region and the second source or drain region; and
- a second contact over the third source or drain region and the fourth source or drain region.

10. The integrated circuit structure of claim 9, wherein the first contact extends laterally between the first source or drain region and the second source or drain region.

11. A computing device, comprising:
- a board; and
- a component coupled to the board, the component including an integrated circuit structure, comprising:
  - a first pair of semiconductor fins, comprising:
    - a first semiconductor fin; and
    - a second semiconductor fin, the second semiconductor fin spaced apart from the first semiconductor fin by a first fin-to-fin distance;
  - a second pair of semiconductor fins, comprising:
    - a third semiconductor fin; and
    - a fourth semiconductor fin, the fourth semiconductor fin spaced apart from the third semiconductor fin by a second fin-to-fin distance, the second fin-to-fin distance substantially the same as the first fin-to-fin distance;
  - a first epitaxial source or drain region on the first semiconductor fin;
  - a second epitaxial source or drain region on the second semiconductor fin, wherein the second epitaxial source or drain region is not merged nor in contact with the first epitaxial source or drain region;
  - a third epitaxial source or drain region on the third semiconductor fin; and
  - a fourth epitaxial source or drain region on the fourth semiconductor fin, wherein the fourth epitaxial source or drain region is merged with the third epitaxial source or drain region.

12. The computing device of claim 11, further comprising:
- a memory coupled to the board.

13. The computing device of claim 11, further comprising:
- a communication chip coupled to the board.

14. The computing device of claim 11, further comprising:
- a camera coupled to the board.

15. The computing device of claim 11, further comprising:
- a battery coupled to the board.

16. The computing device of claim 11, further comprising:
- an antenna coupled to the board.

17. The computing device of claim 11, wherein the component is a packaged integrated circuit die.

18. The computing device of claim 11, wherein the component is selected from the group consisting of a processor, a communications chip, and a digital signal processor.

19. The computing device of claim 11, wherein the computing device is selected from the group consisting of a mobile phone, a laptop, a desk top computer, a server, and a set-top box.

20. The computing device of claim 11, wherein the first epitaxial source or drain region extends laterally beyond the first semiconductor fin, and wherein the second epitaxial source or drain region extends laterally beyond the second semiconductor fin.

21. The computing device of claim 11, wherein the first fin-to-fin distance is from a center of a base of the first semiconductor fin to a center of a base of the second semiconductor fin, and wherein the second fin-to-fin distance is from a center of a base of the third semiconductor fin to a center of a base of the fourth semiconductor fin.

22. The computing device of claim 11, further comprising:
- a first contact over the first epitaxial source or drain region and the second epitaxial source or drain region; and
- a second contact over the third epitaxial source or drain region and the fourth epitaxial source or drain region.

23. The computing device of claim 22, wherein the first contact extends laterally between the first epitaxial source or drain region and the second epitaxial source or drain region.

* * * * *